US012575079B2

(12) United States Patent
Choi et al.

(10) Patent No.: US 12,575,079 B2
(45) Date of Patent: Mar. 10, 2026

(54) SEMICONDUCTOR DEVICE HAVING CONCAVE LOWER SIDEWALL PORTION ON GATE STRUCTURE

(71) Applicant: Samsung Electronics Co., Ltd., Suwon-si (KR)

(72) Inventors: Hyebin Choi, Hwaseong-si (KR); Chansic Yoon, Anyang-si (KR); Gyuhyun Kil, Hwaseong-si (KR); Doosan Back, Seoul (KR); Hyungki Cho, Seoul (KR); Junghoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 867 days.

(21) Appl. No.: 17/750,723

(22) Filed: May 23, 2022

(65) Prior Publication Data

US 2023/0113028 A1 Apr. 13, 2023

(30) Foreign Application Priority Data

Oct. 12, 2021 (KR) ......................... 10-2021-0135132

(51) Int. Cl.
*H10B 12/00* (2023.01)
*H10D 64/01* (2025.01)

(52) U.S. Cl.
CPC ........... *H10B 12/30* (2023.02); *H10D 64/021* (2025.01)

(58) Field of Classification Search
CPC ............................. H10D 64/021; H10B 12/30
See application file for complete search history.

(56) References Cited

U.S. PATENT DOCUMENTS

| | | |
|---|---|---|
| 6,913,980 B2 | 7/2005 | Wu et al. |
| 7,872,312 B2 | 1/2011 | Ogawa |
| 8,502,288 B2 | 8/2013 | Guo et al. |
| 10,121,873 B2 | 11/2018 | Liao et al. |
| 10,276,727 B2 | 4/2019 | Owada et al. |
| 10,381,446 B2 | 8/2019 | Taniguchi et al. |

(Continued)

FOREIGN PATENT DOCUMENTS

| | | |
|---|---|---|
| CN | 106298484 A | 1/2017 |
| KR | 10-2010-0089023 A | 8/2010 |

(Continued)

OTHER PUBLICATIONS

Taiwanese Office Action dated May 9, 2023 issued in Taiwanese Patent Application No. 111121545.

(Continued)

*Primary Examiner* — Alonzo Chambliss
(74) *Attorney, Agent, or Firm* — Fish & Richardson P.C.

(57) ABSTRACT

A semiconductor device including a gate structure on a substrate, a first gate spacer, and a second gate spacer may be provided. A sidewall of the gate structure includes a concave lower sidewall portion and an upper sidewall portion that is vertical with respect to an upper surface of the substrate. The first gate spacer is formed on the upper sidewall portion of the sidewall of the gate structure. The second gate spacer is formed on the concave lower sidewall portion of the sidewall of the gate structure and an outer sidewall of the first gate spacer. The second gate spacer contacts a lower surface of the first gate spacer and includes nitride.

19 Claims, 33 Drawing Sheets

(56)  References Cited

U.S. PATENT DOCUMENTS

| | | |
|---|---|---|
| 10,446,684 B2 | 10/2019 | Zhao |
| 10,896,967 B2 | 1/2021 | Yoon et al. |
| 11,545,554 B2 * | 1/2023 | Back .................... H10D 64/516 |
| 2010/0197124 A1 | 8/2010 | Jeong et al. |
| 2014/0042501 A1 | 2/2014 | Chen et al. |
| 2019/0348520 A1 | 11/2019 | Kuo et al. |
| 2019/0371799 A1 | 12/2019 | Yoshida et al. |
| 2020/0091305 A1 * | 3/2020 | Yoon ................. H10D 30/0278 |

FOREIGN PATENT DOCUMENTS

| | | |
|---|---|---|
| KR | 10-2012-0003311 A | 1/2012 |
| KR | 10-2012-0080096 A | 7/2012 |
| KR | 10-2014-0110146 A | 9/2014 |
| KR | 10-2020-0030909 A | 3/2020 |
| TW | 202011517 A | 3/2020 |
| WO | WO-2016/178392 A1 | 11/2016 |
| WO | WO-2016/194827 A1 | 12/2016 |

OTHER PUBLICATIONS

Office Action in Korean Appln. No. 10-2021-0135132, mailed on Aug. 27, 2025, 14 pages (with English translation).
Notice of Allowance in Korean Appln. No. 10-2021-0135132, mailed on Jan. 29, 2026, 6 pages (with English translation).

* cited by examiner 190
180
170
160
150
140
130
120
110

SEMICONDUCTOR DEVICE HAVING CONCAVE LOWER SIDEWALL PORTION ON GATE STRUCTURE

CROSS-REFERENCE TO RELATED APPLICATION

This application claims priority under 35 U.S.C. § 119 to Korean Patent Application No. 10-2021-0135132 filed on Oct. 12, 2021 in the Korean Intellectual Property Office, the disclosure of which is hereby incorporated by reference in its entirety.

BACKGROUND

Technical Field

Example embodiments of the present disclosure relate to semiconductor devices. More particularly, example embodiments of the present disclosure relate to DRAM devices.

Description of Related Art

In a DRAM device, a gate structure and a gate spacer structure covering a sidewall of the gate structure may be formed on a substrate. As the DRAM device is highly integrated, the electrical characteristics of the gate structure may deteriorate during the fabrication of the DRAM device, and thus the gate spacer structure that may enhance the electrical characteristics of the gate structure is needed.

SUMMARY

Some example embodiments provide semiconductor devices having improved characteristics.

According to an example embodiment of the inventive concepts, a semiconductor device may include a gate structure on a substrate, a first gate spacer, and a second gate spacer. A sidewall of the gate structure may include a concave lower sidewall portion and an upper sidewall portion that is vertical with respect to an upper surface of the substrate. The first gate spacer may be formed on the upper sidewall portion of the sidewall of the gate structure. The second gate spacer may be formed on the concave lower sidewall portion of the sidewall of the gate structure and an outer sidewall of the first gate spacer. The second gate spacer may contact a lower surface of the first gate spacer and includes a nitride.

According to an example embodiment of the inventive concepts, a semiconductor device may include a gate structure on a substrate, a first gate spacer, and a second gate spacer. The gate structure may include a first dielectric pattern containing silicon oxide. The first gate spacer may contact an upper portion of a sidewall of the gate structure, the first gate spacer including silicon nitride. The second gate spacer may contact a lower portion of the sidewall of the gate structure and an outer sidewall of the first gate spacer, and may include silicon nitride. A lower surface of the first gate spacer may be lower than an upper surface of the first dielectric pattern. The second gate spacer may not contact an upper portion of a sidewall of the first dielectric pattern, but may contact a lower portion of the sidewall of the first dielectric pattern.

According to an example embodiment of the inventive concepts, a semiconductor device may include a substrate, a first active pattern, a second active pattern, an isolation pattern, a first gate structure, a second gate structure, a gate spacer, a bit line structure, a contact plug structure, and a capacitor. The substrate may include a cell region and a peripheral circuit region surrounding the cell region. The first active pattern may be formed on the cell region of the substrate. The second active pattern may be formed on the peripheral circuit region of the substrate. The isolation pattern may cover sidewalls of the first and second active patterns. The first gate structure may be buried at upper portions of the first active pattern and the isolation pattern, and may extend in a first direction substantially parallel to an upper surface of the substrate. The second gate structure may be formed on the second active pattern, and a sidewall of the second gate structure may include a concave lower sidewall portion and an upper sidewall portion that is vertical with respect to the upper surface of the substrate. The first gate spacer may be formed on the upper sidewall portion of the sidewall of the second gate structure. The second gate spacer may be formed on the concave lower sidewall portion of the sidewall of the second gate structure and an outer sidewall of the first gate spacer, and may contact a lower surface of the first gate spacer and including silicon nitride. The third gate spacer may be formed on an outer sidewall of the second gate spacer. The bit line structure may contact a central upper surface of the first active pattern, and may extend in a second direction substantially parallel to the upper surface of the substrate and substantially perpendicular to the first direction. The contact plug structure may contact each of opposite edge upper surfaces of the first active pattern. The capacitor may be formed on the contact plug structure.

In the semiconductor device in accordance with some example embodiments, the gate spacer including a nitride may contact a sidewall of the gate structure, and thus the electrical characteristics of the semiconductor may be enhanced.

BRIEF DESCRIPTION OF THE DRAWINGS

FIGS. 12 to 37 are plan views and cross-sectional views illustrating a method of manufacturing a semiconductor device according to an example embodiment.

DETAILED DESCRIPTION

The above and other aspects and features of a method of cutting a fine pattern, a method of forming active patterns using the same, and a method of manufacturing a semiconductor device using the same in accordance with some example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, two directions substantially parallel to an upper surface of the substrate and substantially perpendicular to each other may be defined as first and second directions D1 and D2, respectively, and a direction substantially perpendicular to the upper surface of the substrate and having an acute angle with respect to the first and second directions D1 and D2 may be defined as a third direction D3.

Figure 1:
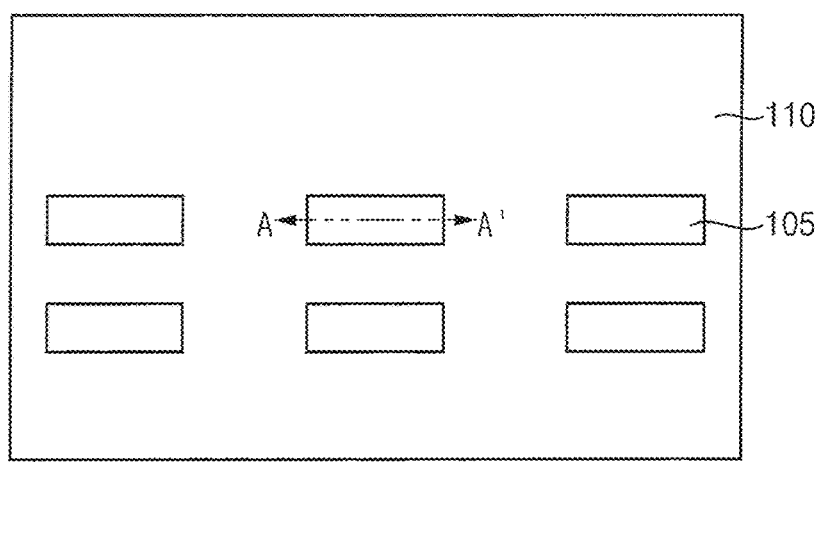
FIGS. 1 to 9 are plan views and cross-sectional views illustrating a method of manufacturing a semiconductor device in accordance with an example embodiment.
Figure 6:
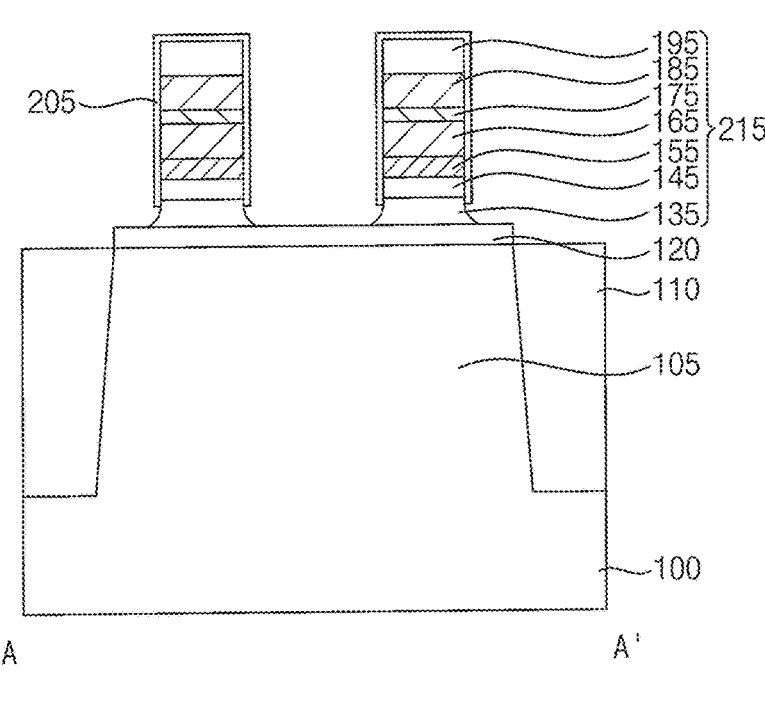
Figure 7:
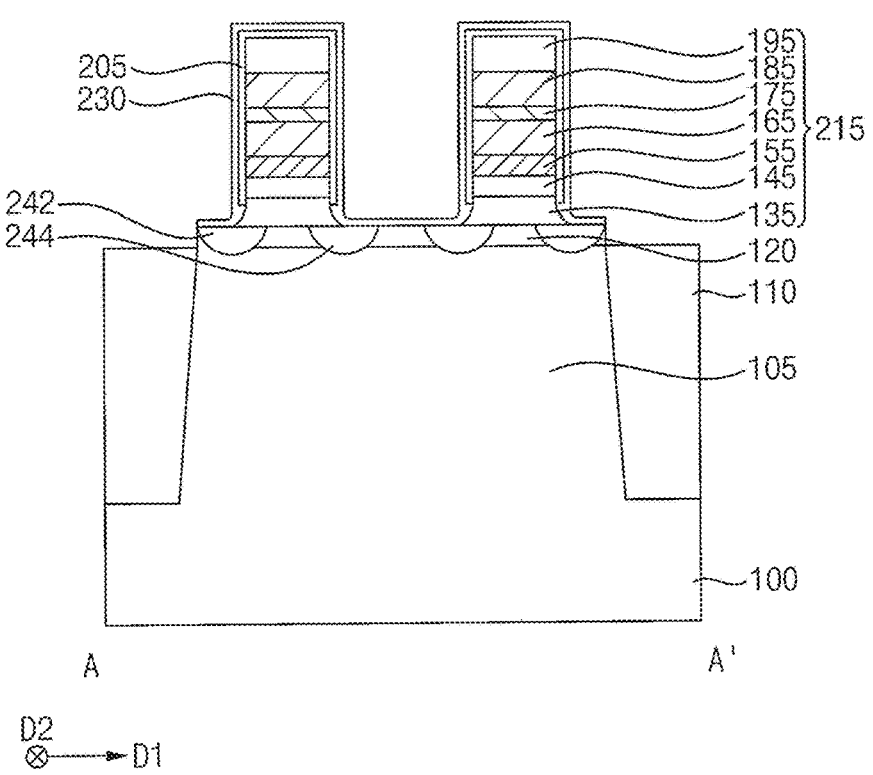
Figure 8:
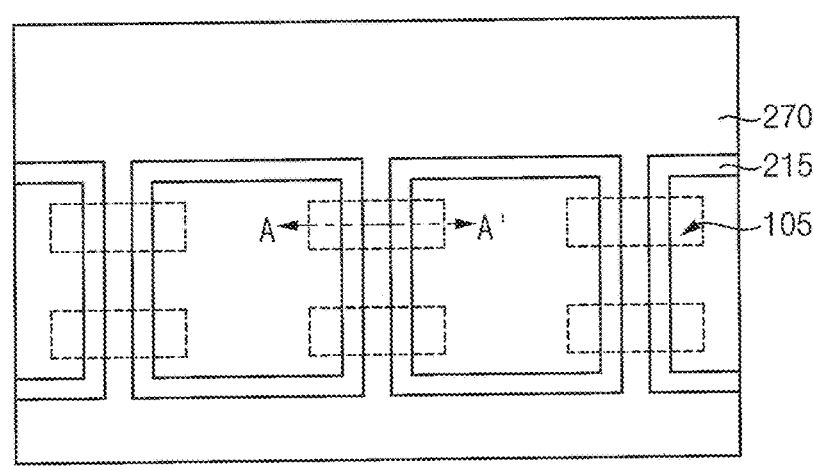
Figure 8:
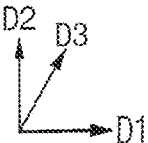

FIGS. 1 to 9 are plan views and cross-sectional views illustrating a method of manufacturing a semiconductor device in accordance with an example embodiment. FIGS. 1 and 8 are plan views, and FIGS. 2-7 and 9 are cross-sectional views taken along lines A-A' of corresponding plan views, respectively.

Figure 2:
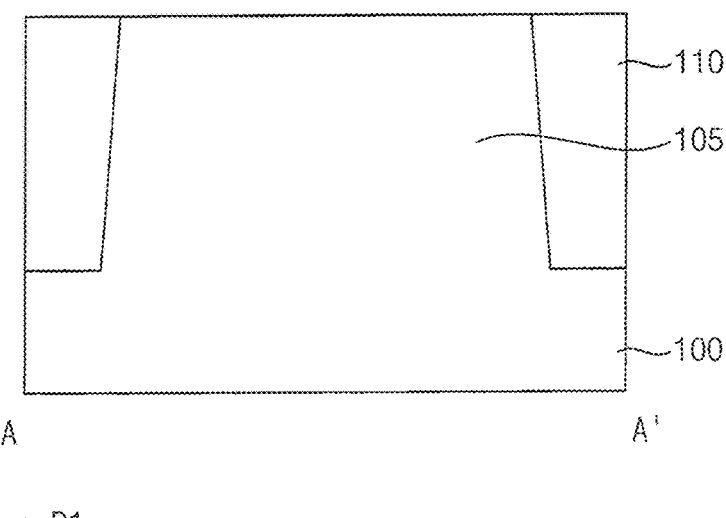

Referring to FIGS. 1 and 2, an active pattern 105 may be formed on a substrate 100, and an isolation pattern 110 may be formed to cover a sidewall of the active pattern 105.

The substrate 100 may include silicon, germanium, silicon-germanium, or a III-V group compound semiconductor, such as GaP, GaAs, or GaSb. In some example embodiments, the substrate 100 may be a silicon-on-insulator (SOI) substrate or a germanium-on-insulator (GOI) substrate.

The active pattern 105 may be formed by removing an upper portion of the substrate 100 to form a first recess, and a plurality of active patterns 105 may be formed to be spaced apart from each other in each of the first and second directions D1 and D2.

The isolation pattern 110 may include an oxide (e.g., silicon oxide).

Figure 3:
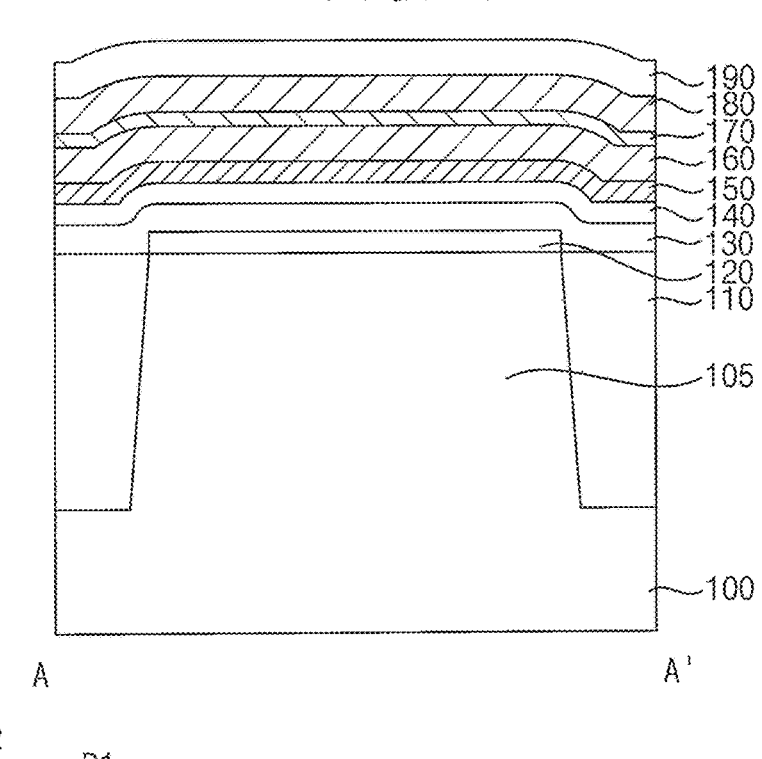

Referring to FIG. 3, a selective epitaxial growth (SEG) process may be performed using an upper surface of the active pattern 105 as a seed to form an epitaxial layer 120 on the active pattern 105.

In an example embodiment, the SEG process may be performed using a silicon source gas (e.g., dichlorosilane ($H_2SiCl_2$) gas) and a p-type impurity source gas (e.g., diborane ($B_2H_6$) gas), and thus the epitaxial layer 120 may be a single crystalline silicon layer doped with p-type impurities.

In an example embodiment, the SEG process may be performed using a silicon source gas (e.g., disilane ($Si_2H_6$) gas) and an n-type impurity source gas (e.g., $PH_3$, $POCl_3$, or $P_2O_5$) and thus the epitaxial layer 120 may be a single crystalline silicon layer doped with n-type impurities.

First and second dielectric layers 130 and 140, a work function control layer 150, a first conductive layer 160, a barrier layer 170, a second conductive layer 180 and a capping layer 190 may be sequentially formed on the isolation pattern 110 and the epitaxial layer 120.

The first dielectric layer 130 may include an oxide (e.g., silicon oxide), and the second dielectric layer 140 may include a material having a dielectric constant higher than that of silicon oxide (e.g., a high-k material).

In some example embodiments, the second dielectric layer 140 may include hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO).

The work function control layer 150 may include metal (e.g., tantalum, titanium, aluminum, or nickel), metal nitride (e.g., tantalum nitride or titanium nitride), or a metal carbide (e.g., tantalum carbide or titanium carbide).

The first and second conductive layers 160 and 180 may include metal (e.g., tungsten, molybdenum, tantalum, or titanium), the barrier layer 170 may include metal nitride (e.g., tungsten nitride, molybdenum nitride, tantalum nitride, or titanium nitride), and the capping layer 190 may include nitride (e.g., silicon nitride).

Figure 4:
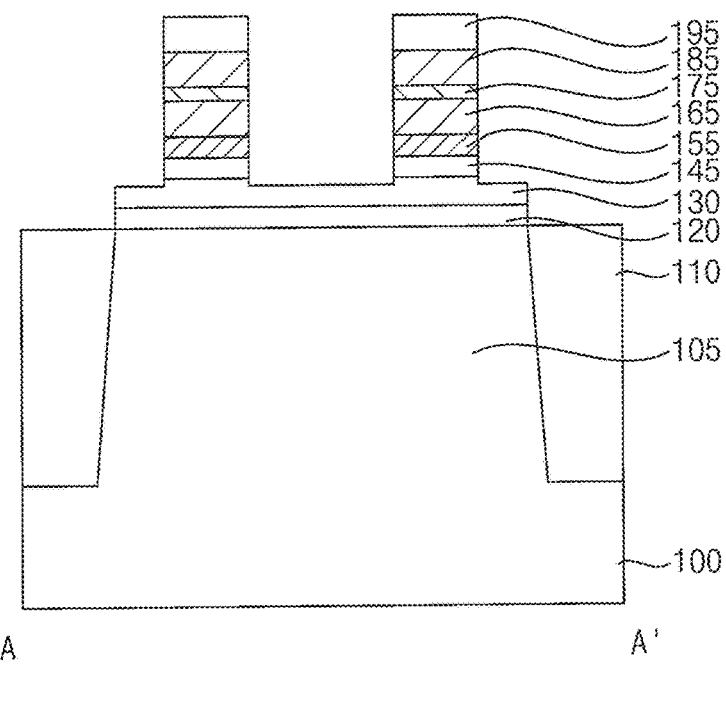

Referring to FIG. 4, the capping layer 190, the second conductive layer 180, the barrier layer 170, the first conductive layer 160, the work function control layer 150 and the second dielectric layer 140 may be sequentially etched to form a capping pattern 195, a second conductive pattern 185, a barrier pattern 175, a first conductive pattern 165, a work function control pattern 155 and a second dielectric pattern 145, respectively. During the etching process, an upper portion of the first dielectric layer 130 may also be etched.

Figure 5:
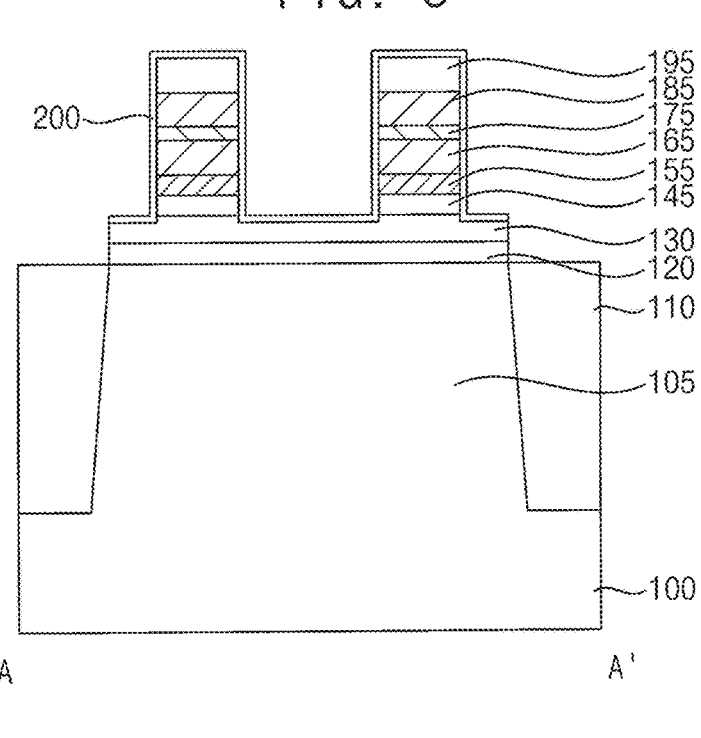

Referring to FIG. 5, a first gate spacer layer 200 may be formed on the first dielectric layer 130, the second dielectric pattern 145, the work function control pattern 155, the first conductive pattern 165, the barrier pattern 175, the second conductive pattern 185 and the capping pattern 195.

The first gate spacer layer 200 may include a nitride (e.g., silicon nitride).

Referring to FIG. 6, the first gate spacer layer 200 may be anisotropically etched to form a first gate spacer 205 covering sidewalls of the capping pattern 195, the second conductive pattern 185, the barrier pattern 175, the first conductive pattern 165, the work function control pattern 155 and the second dielectric pattern 145, and the first dielectric layer 130 may also be etched to form a first dielectric pattern 135. The first gate spacer 205 may cover an upper sidewall of the first dielectric pattern 135.

Hereinafter, the first and second dielectric patterns 135 and 145, the work function control pattern 155, the first conductive pattern 165, the barrier pattern 175, the second conductive pattern 185, and the capping pattern 195 that are stacked in a vertical direction substantially perpendicular to the upper surface of the substrate 100 may be collectively referred to as a gate structure 215. The gate structure 215 may partially overlap the active pattern 105 in the vertical direction.

A cleaning process may be performed using a cleaning solution including hydrofluoric acid (HF), and a lower portion of the first dielectric pattern 135 not covered by the first gate spacer 205 may also be removed. Thus, the first dielectric pattern 135 may include a concave lower sidewall and a vertical upper sidewall. In other words, the first dielectric pattern 135 may include a sidewall including a concave lower sidewall portion and a vertical upper sidewall portion. The first gate spacer 205 may contact most portion of a sidewall of the gate structure 215 except for a lower portion thereof, and a lower surface of the first gate spacer 205 may be lower than an upper surface of the first dielectric pattern 135.

Referring to FIG. 7, a second gate spacer layer 230 may be formed on an upper surface of the epitaxial layer 120, an outer sidewall of the first gate spacer 205 and a lower sidewall of the gate structure 215.

The second gate spacer layer 230 may include a nitride, e.g., silicon nitride.

First impurities may be lightly doped into the epitaxial layer 120 and an upper portion of the active pattern 105 to form first and second impurity regions 242 and 244.

In some example embodiments, the first impurities may be doped in a direction having an acute angle with respect to the vertical direction and a horizontal direction substantially parallel to the upper surface of the substrate 100, and thus the first and second impurity regions 242 and 244 may partially overlap the gate structure 215 in the vertical direction. Additionally, the first dielectric pattern 135 may be covered by the first gate spacer 205 and the second gate spacer layer 230, and thus may not be damaged by the doping process.

In an example embodiment, if the epitaxial layer 120 is a single crystalline silicon layer doped with p-type impurities, the first impurities may be n-type impurities. Alternatively, if the epitaxial layer 120 is a single crystalline silicon layer doped with n-type impurities, the first impurities may be p-type impurities.

Figure 9:
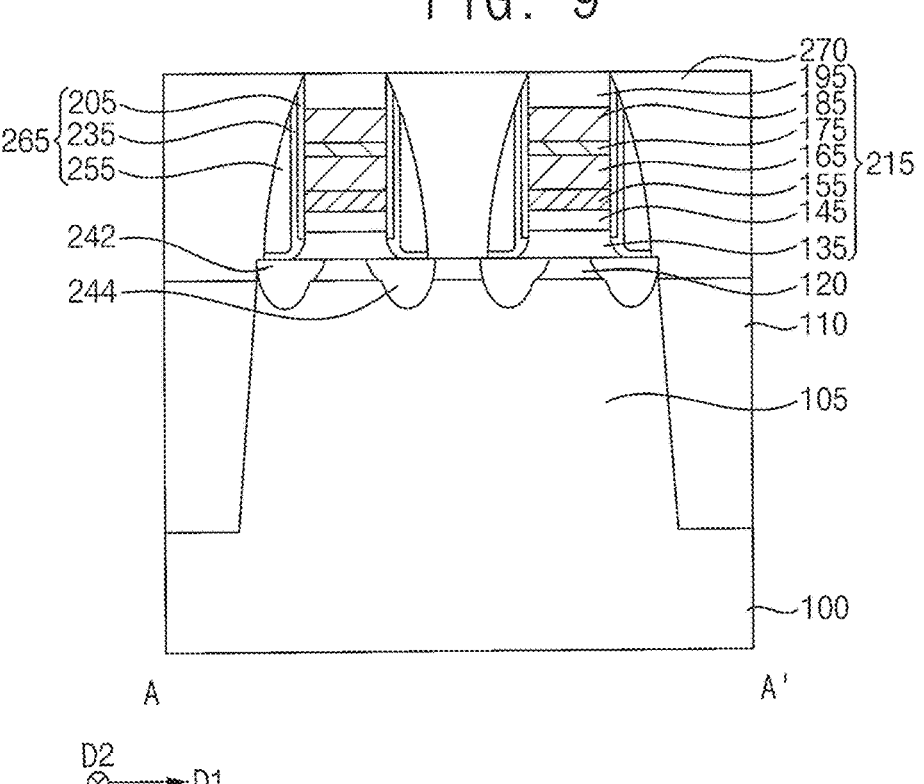

Referring to FIGS. 8 and 9, a third gate spacer layer may be formed on the second gate spacer layer 230, and the second gate spacer layer 230 and the third gate spacer layer may be anisotropically etched to form second and third gate spacers 235 and 255, respectively. The first to third gate spacers 205, 235 and 255 may form a gate spacer structure 265.

The second gate spacer 235 may contact the lower sidewall of the gate structure 215 and the outer sidewall of the first gate spacer 205, and thus may contact the lower sidewall of the first dielectric pattern 135. The second gate spacer 235 may contact the lower surface of the first gate spacer 205.

In some example embodiments, a cross-section of the second gate spacer 235 in the vertical direction may have an "L" shape, and thus may contact the first and second impurity regions 242 and 244.

The third gate spacer 255 may contact an outer sidewall of the second gate spacer 235. In some example embodiments, the third gate spacer 255 may not contact the first and second impurity regions 242 and 244.

The third gate spacer layer may include an oxide (e.g., silicon oxide).

In some example embodiments, a volume of the third gate spacer 255 may be greater than a sum of volumes of the first and second gate spacers 205 and 235. That is, the volume of the third gate spacer 255 including an oxide may be greater than the sum of the volumes of the first and second gate spacers 205 and 235 including a nitride, and thus a parasitic capacitance between the gate spacer structure 265 and the gate structure 215 may be low.

Second impurities may be doped into the first and second impurity regions 242 and 244.

In some example embodiments, the second impurities may be doped in the vertical direction, and thus the first and second impurity regions 242 and 244 may be enlarged in the vertical direction. The first dielectric pattern 135 may be covered by the gate spacer structure 265, and thus may not be damaged by the doping process.

The first and second impurity regions 242 and 244 may serve as source/drain regions.

In an example embodiment, if the epitaxial layer 120 is a single crystalline silicon layer doped with p-type impurities, the second impurities may be n-type impurities. In an example embodiment, if the epitaxial layer 120 is a single crystalline silicon layer doped with n-type impurities, the second impurities may be p-type impurities.

An insulating interlayer 270 may be formed on the isolation pattern 110, the epitaxial layer 120, the gate structure 215 and the gate spacer structure 265, and may be planarized until an upper surface of the gate structure 215 is exposed to complete the fabrication of the semiconductor device.

The insulating interlayer 270 may include an oxide (e.g., silicon oxide).

As illustrated above, before doping the first impurities into the epitaxial layer 120 and the upper portion of the active pattern 105, the second gate spacer 235 may be formed to contact the lower sidewall of the first dielectric pattern 135 including, for example, silicon oxide.

If the second gate spacer 235 includes, for example, silicon oxide, the second gate spacer 235 may be damaged by doping the first impurities, and the damaged second gate spacer 235 may be merged with the first dielectric pattern 135. That is, time dependent dielectric breakdown (TDDB) may occur to the first dielectric pattern 135 due to the damaged second gate spacer 235, and thus the electric characteristics of the semiconductor device may deteriorate.

However, in some example embodiments, the second gate spacer 235 may include a nitride (e.g., silicon nitride). Thus, even if the second gate spacer 235 is damaged by doping the first impurities, the second gate spacer 235 may not be merged with the first dielectric pattern 135. Accordingly, the TDDB may not occur to the first dielectric pattern 135, and thus the electric characteristics of the semiconductor device may not deteriorate but may be enhanced.

The semiconductor device manufactured by the above processes may include the gate structure 215 on the active pattern 105 of the substrate 100, the gate spacer structure 265 on the sidewall of the gate structure 215, and the first and second impurity regions 242 and 244 at upper portions of the active pattern 105 that are adjacent to the gate structure 215. The semiconductor device may further include the isolation pattern 110, the epitaxial layer 120 and the insulating interlayer 270.

The gate structure 215 may include the first and second dielectric patterns 135 and 145, the work function control pattern 155, the first conductive pattern 165, the barrier pattern 175, the second conductive pattern 185 and the capping pattern 195 sequentially stacked in the vertical direction. The gate spacer structure 265 may include the first to third gate spacers 205, 235 and 255 sequentially stacked in the second direction D2.

Figure 10:
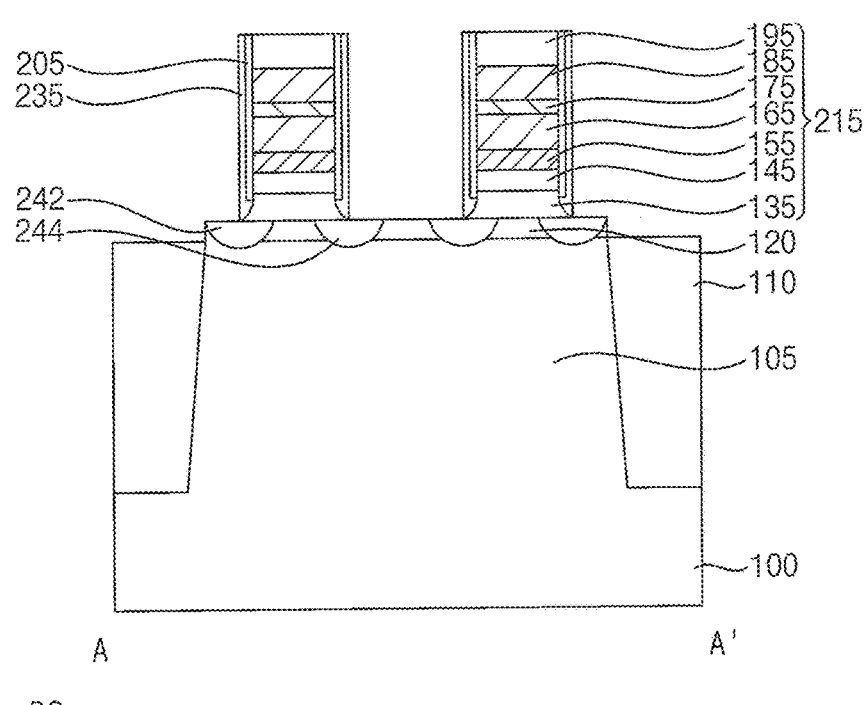
FIGS. 10 and 11 are cross-sectional views illustrating a method of manufacturing a semiconductor device in accordance with an example embodiment.
Figure 11:
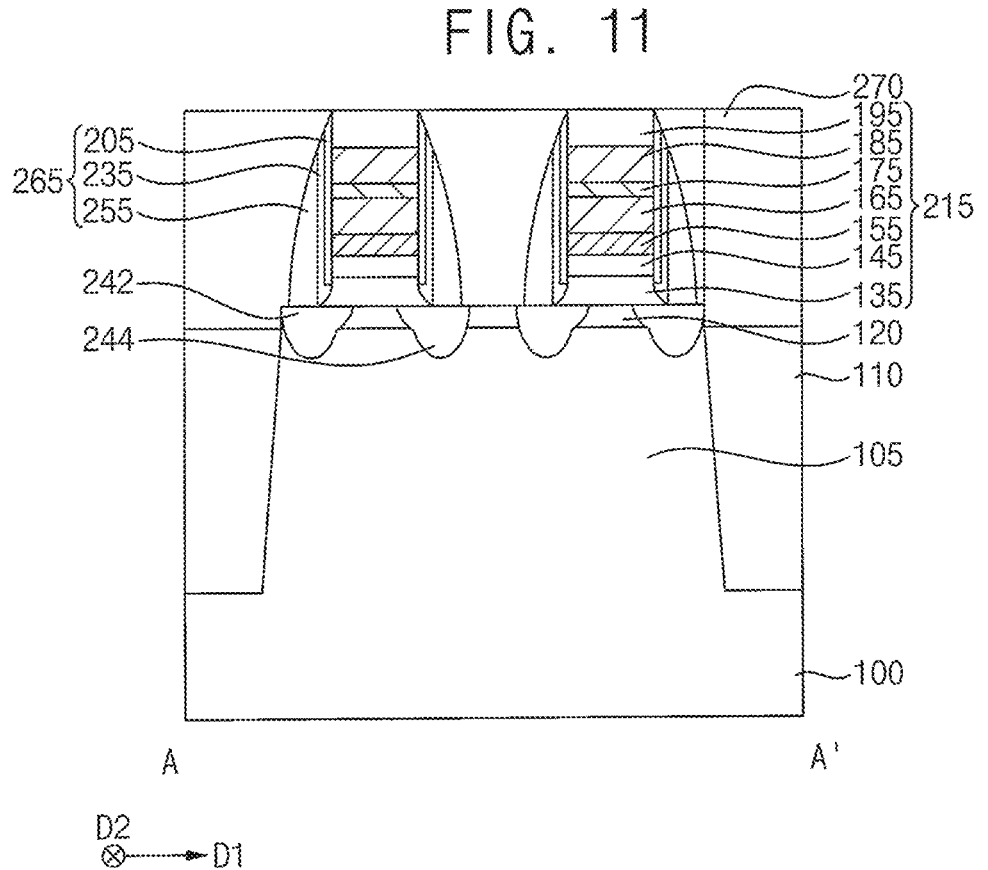

FIGS. 10 and 11 are cross-sectional views illustrating a method of manufacturing a semiconductor device in accordance with an example embodiment. This method may include processes the same as or substantially similar to those illustrated with reference to FIGS. 1 to 9, and thus repeated explanations thereof are omitted herein.

Referring to FIG. 10, processes the same as or substantially similar to those illustrated with reference to FIGS. 1 to 7 may be performed.

Thus, the second gate spacer layer 230 may be formed on the upper surface of the epitaxial layer 120, the outer sidewall of the first gate spacer 205 and the lower sidewall of the gate structure 215, and may be anisotropically etched to form the second gate spacer 235.

The second gate spacer 235 may not be formed on the upper surface of the epitaxial layer 120. In other words, the second gate spacer 235 may contact the first and second impurity regions 242 and 244, and may not contact the upper surface of the epitaxial layer 120 between the first and second impurity regions 242 and 244.

Referring to FIG. 11, the third gate spacer layer may be formed on the upper surface of the epitaxial layer 120, the outer sidewall of the second gate spacer 235 and the upper surface of the gate structure 215, and may be anisotropically etched to form the third gate spacer 255.

In some example embodiments, the third gate spacer 255 may contact the first and second impurity regions 242 and 244.

The insulating interlayer 270 may be formed on the isolation pattern 110, the epitaxial layer 120, the gate structure 215 and the gate spacer structure 265 to complete the fabrication of the semiconductor device.

FIGS. 12 to 37 are plan views and cross-sectional views illustrating a method of manufacturing a semiconductor device according to an example embodiment. FIGS. 12, 19, 23, 25, 30 and 34 are the plan views, and each of FIGS. 13-18, 20-22, 24, 26-29, 31-33 and 35-37 includes cross-sections taken along lines B-B', C-C' and D-D' of a corresponding plan view.

This method is application of the method of manufacturing the semiconductor device illustrated with reference to FIGS. 1 to 9 to a method of manufacturing a dynamic random access memory (DRAM) device, and repeated descriptions on the method of manufacturing the semiconductor device are omitted herein.

Figure 12:
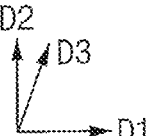
Figure 13:
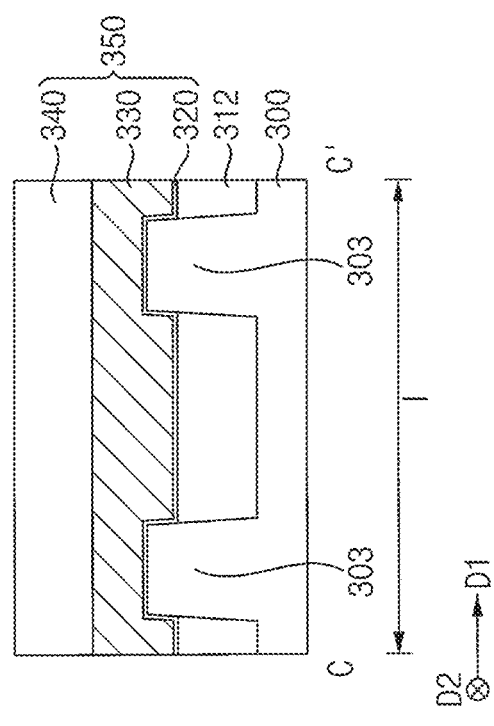
Figure 13:
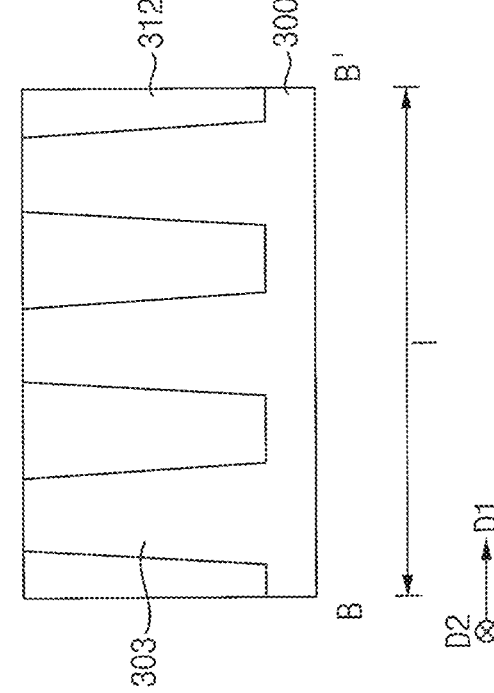
Figure 14:
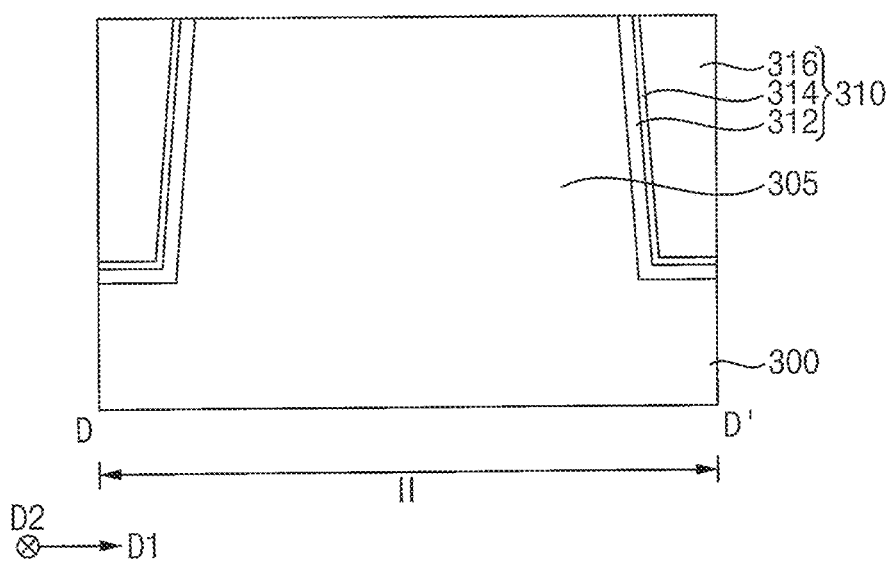

Referring to FIGS. 12 to 14, first and second active patterns 303 and 305 may be formed on a substrate 300 including first and second regions I and II, and an isolation pattern structure 310 may be formed to cover sidewalls of the first and second active patterns 303 and 305.

The first region I of the substrate 300 may be a cell region on which memory cells are formed, and the second region II of the substrate 300 may be a peripheral circuit region on which peripheral circuit patterns for driving the memory cells are formed. FIGS. 12 to 14 show a portion of the first region I and a portion of the second region II adjacent to the first region I in the second direction D2.

The first and second active patterns 303 and 305 may be formed by removing an upper portion of the substrate 300 to form a first recess. The first active pattern 303 may extend in the third direction D3, and a plurality of first active patterns 303 may be spaced apart from each other in each of the first and second directions D1 and D2. Further, a plurality of second active patterns 305 may be spaced apart from each other in each of the first and second directions D1 and D2. FIG. 12 shows only three second active patterns 305 adjacent to each other in the first direction D1 as an example.

In some example embodiments, the isolation pattern structure 310 may include first to third isolation patterns 312, 314 and 316 sequentially stacked from an inner wall of the first recess. The first recess in the first region I of the substrate 300 may have a relatively small width, and thus only the first isolation pattern 312 may be formed in the first recess. However, the first recess in the second region II of the substrate 300 or between the first and second regions I and II of the substrate 300 may have a relatively large width, and thus all of the first to third isolation patterns 312, 314 and 316 may be formed in the first recess.

The first and third isolation patterns 312 and 316 may include an oxide (e.g., silicon oxide), and the second isolation pattern 314 may include a nitride (e.g., silicon nitride).

The first active pattern 303 and the isolation pattern structure 310 on the first region I of the substrate 300 may be partially removed to form a second recess extending in the first direction D1.

A first gate structure 350 may be formed in the second recess. The first gate structure 350 may include a gate insulation layer 320 on a bottom and a sidewall of the second recess, a gate electrode 330 on the gate insulation layer 320 to fill a lower portion of the second recess, and a gate mask 340 on the gate electrode 330 to fill an upper portion of the second recess. The first gate structure 350 may extend in the first direction D1 on the first region I of the substrate 300, and a plurality of first gate structures 350 may be spaced apart from each other in the second direction D2.

The gate insulation layer 320 may include oxide (e.g., silicon oxide), the gate electrode 330 may include, for example, metal, metal nitride, metal silicide, or doped polysilicon, and the gate mask 340 may include nitride (e.g., silicon nitride).

Figure 15:
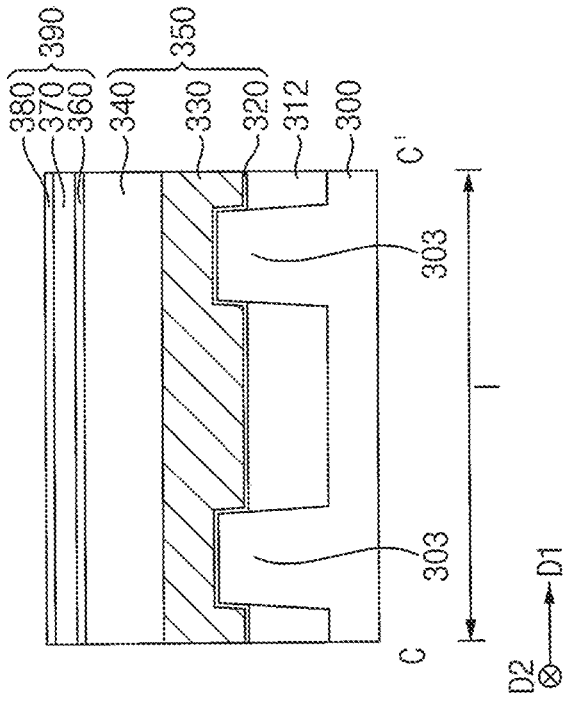
Figure 15:
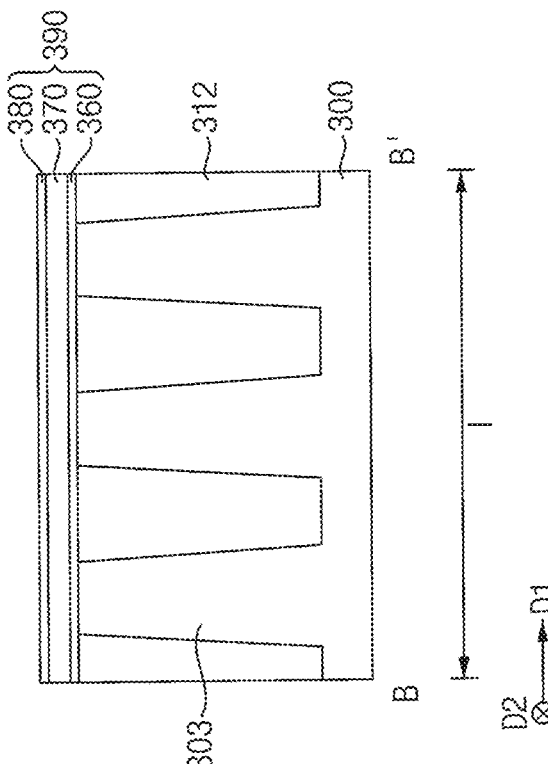
Figure 16:
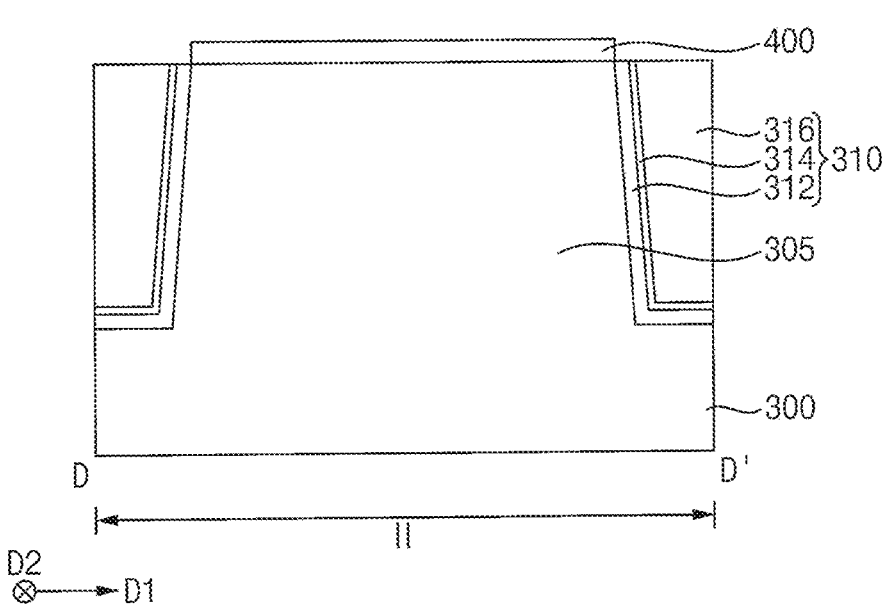

Referring to FIGS. 15 and 16, an insulation layer structure 390 may be formed on the first and second regions I and II of the substrate 300.

The insulation layer structure 390 may include first, second, and third insulation layers 360, 370 and 380 sequentially stacked. The first and third insulation layers 360 and 380 may include oxide (e.g., silicon oxide), and the second insulation layer 370 may include a nitride (e.g., silicon nitride).

A portion of the insulation layer structure 390 in the second region II of the substrate 300 may be removed, and a SEG process may be performed using an upper surface of the second active pattern 305 as a seed to form an epitaxial layer 400 on the second active pattern 305.

Figure 17:
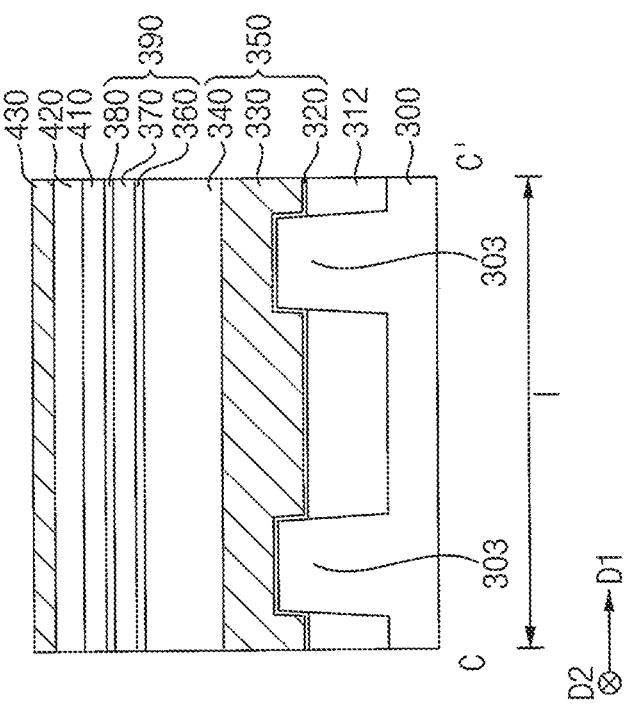
Figure 17:
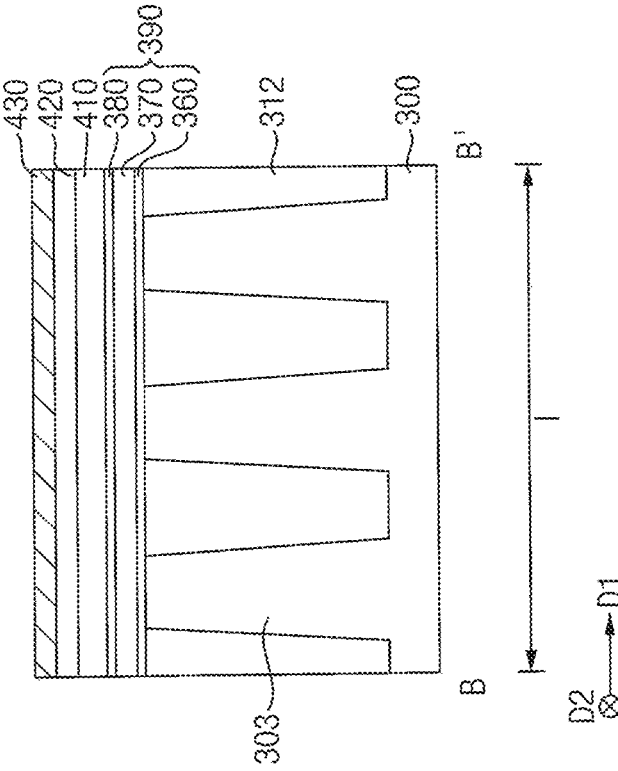
Figure 18:
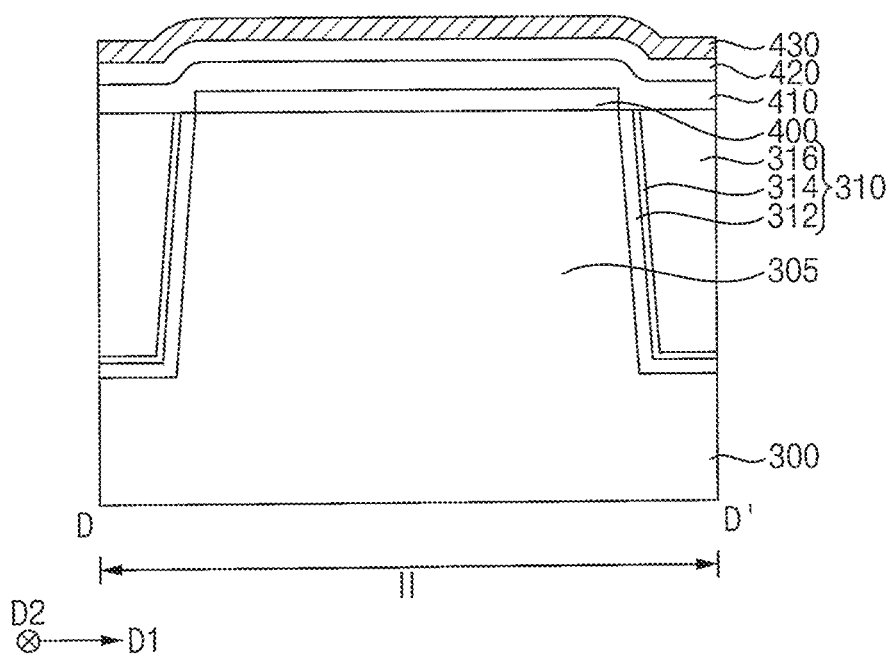

Referring to FIGS. 17 and 18, first and second dielectric layers 410 and 420 and a work function control layer 430 may be sequentially formed on the insulation layer structure 390 on the first region I of the substrate 300 and the epitaxial layer 400 and the isolation pattern structure 310 on the second region II of the substrate 300.

Figure 19:
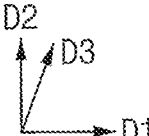
Figure 20:
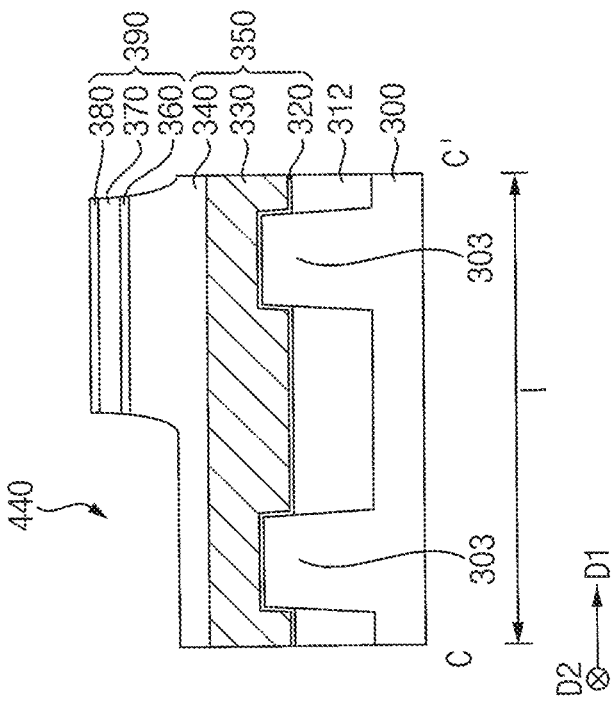
Figure 20:
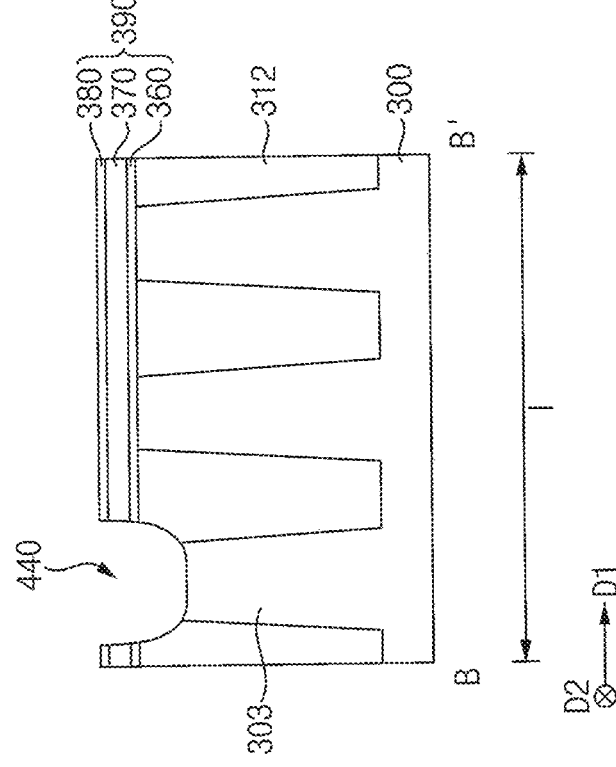

Referring to FIGS. 19 and 20, portions of the first and second dielectric layers 410 and 420 and the work function control layer 430 on the first region I of the substrate 300 may be removed, the insulation layer structure 390 may be patterned, and the first active pattern 303, the isolation pattern structure 310 and the first gate structure 350 may be partially etched using the patterned insulation layer structure 390 as an etching mask to form a first opening 440.

In some example embodiments, the patterned insulation layer structure 390 may have a shape of a circle or ellipse in a plan view, and a plurality of patterned insulation layer structures 390 may be spaced apart from each other in each of the first and second directions D1 and D2. Each of the patterned insulation layer structures 390 may overlap in the vertical direction a corresponding end portion of the end portions of a corresponding one of the first active patterns 303. The end portions of a corresponding one of the first active patterns 303 faces each other in the third direction D3.

Figure 21:
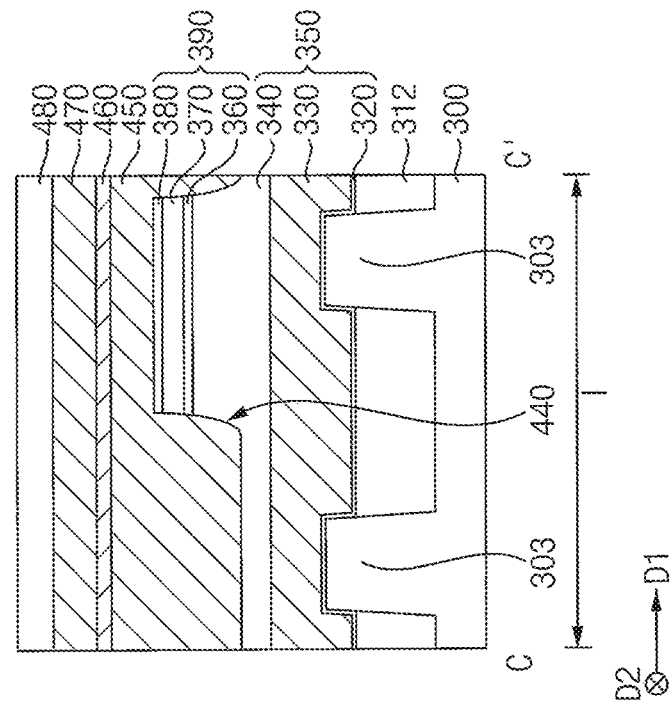
Figure 21:
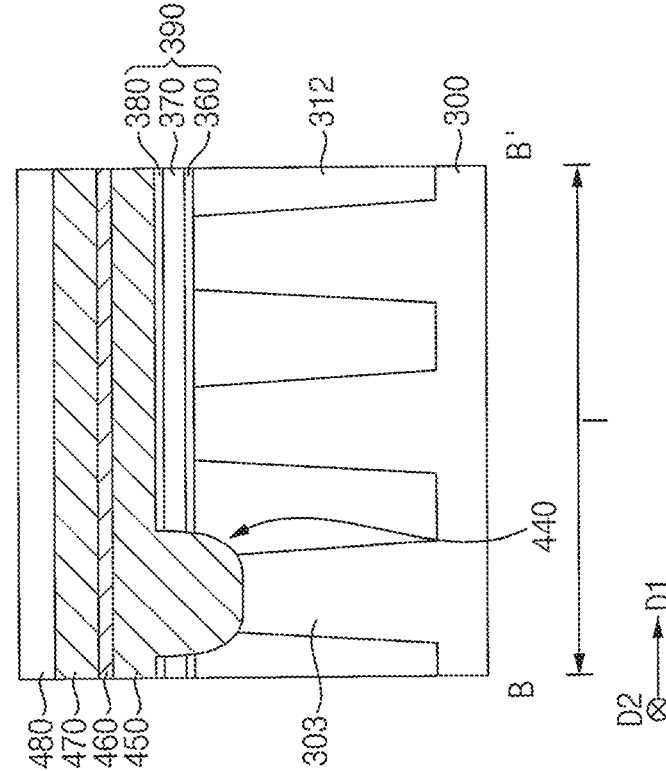
Figure 22:
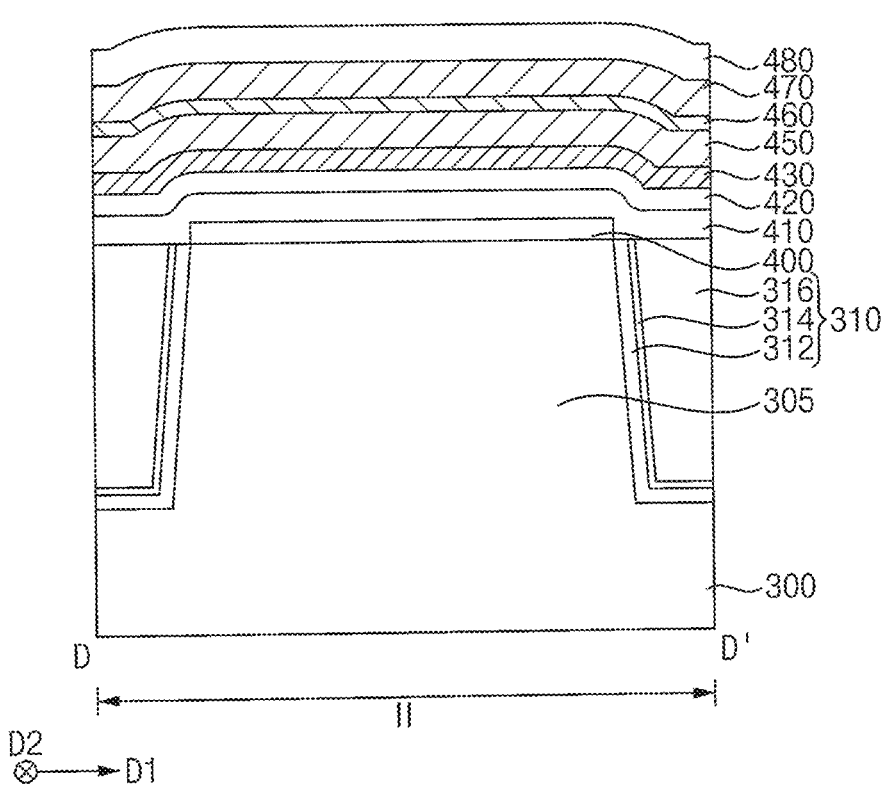

Referring to FIGS. 21 and 22, a first conductive layer 450, a barrier layer 460, a second conductive layer 470 and a capping layer 480 may be sequentially stacked on the insulation layer structure 390, the first active pattern 303 exposed by the first opening 440, the isolation pattern structure 310 and the first gate structure 350 on the first region I of the substrate 300 and the work function control layer 430 on the second region II of the substrate 300, which may form a conductive layer structure. The first conductive layer 450 may fill the first opening 440.

Figure 23:
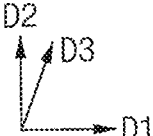
Figure 24:
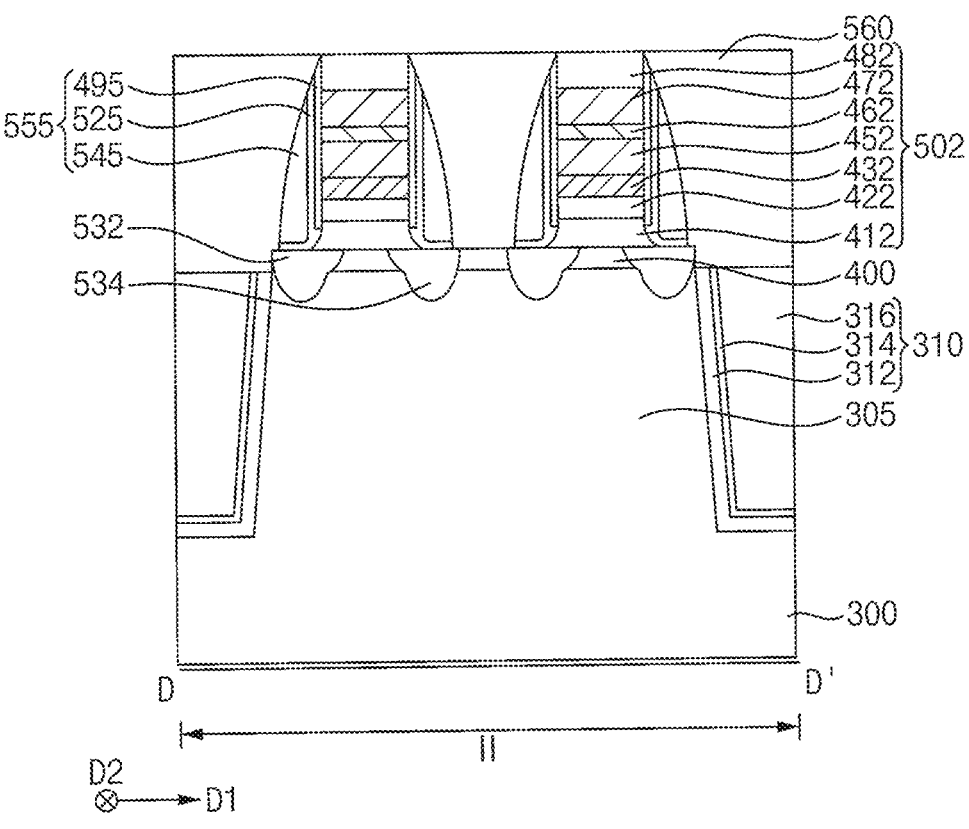

Referring to FIGS. 23 and 24, processes the same as or substantially similar to those illustrated with reference to FIGS. 4 to 9 may be performed, so that a second gate structure 502, a gate spacer structure 555, first and second impurity regions 532 and 534 and a first insulating interlayer 560 may be formed on the second region II of the substrate 300.

The second gate structure 502 may include first and second dielectric patterns 412 and 422, a work function control pattern 432, a first conductive pattern 452, a first barrier pattern 462, a second conductive pattern 472 and a first capping pattern 482 sequentially stacked in the vertical direction, and the gate spacer structure 555 may include first to third gate spacers 495, 525 and 545 sequentially and laterally stacked in the first direction D2.

Figure 25:
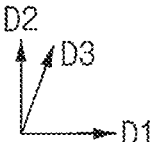
Figure 26:
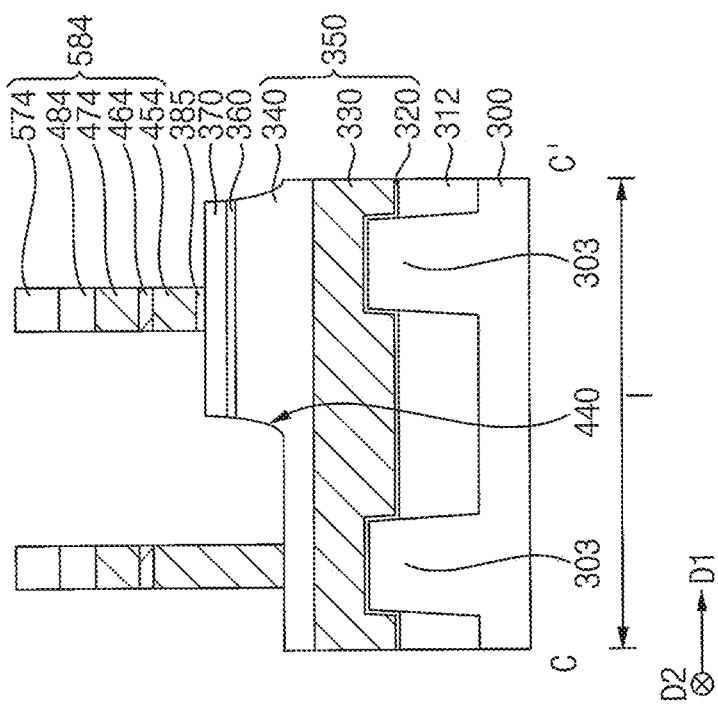
Figure 26:
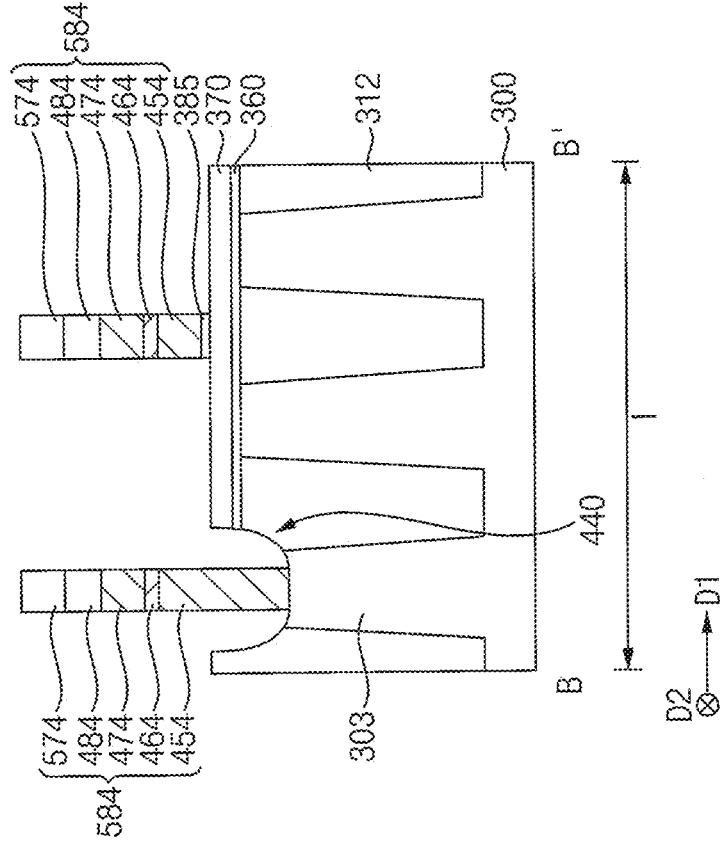
Figure 27:
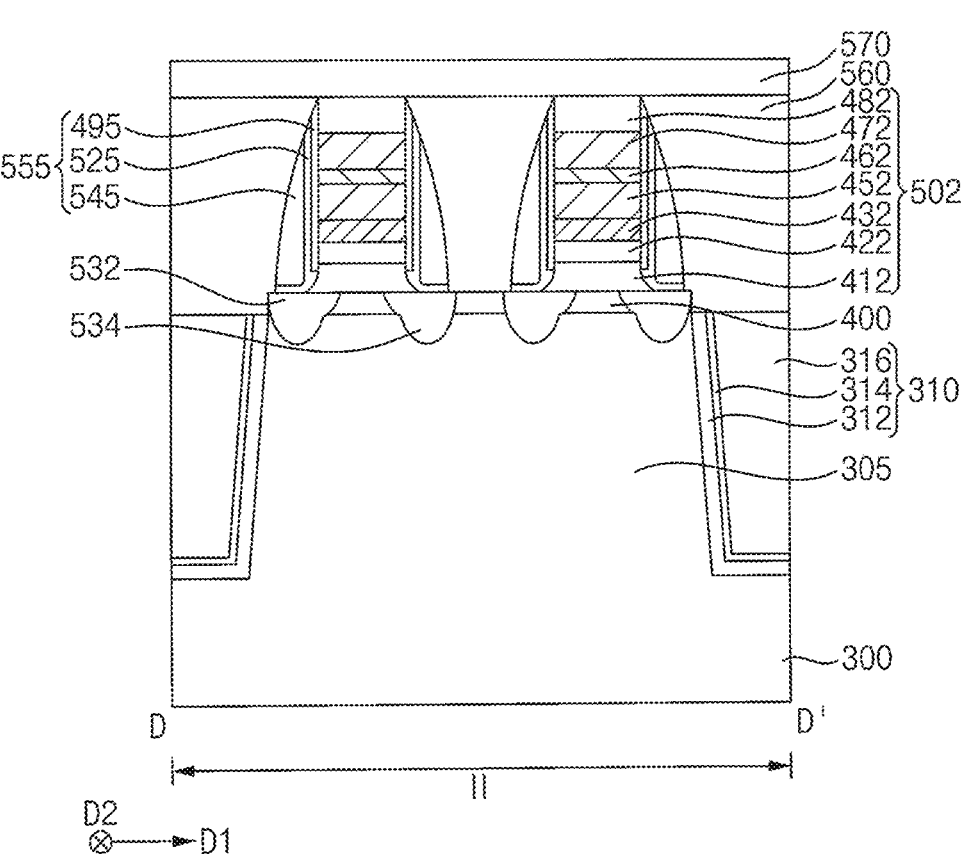

Referring to FIGS. 25 to 27, a first mask layer may be formed on the conductive structure layer on the first region I of the substrate 300, and on the second gate structure 502 and the first insulating interlayer 560 on the second region II of the substrate 300, and a portion of the first mask layer on the first region I of the substrate 300 may be etched to form a first mask 574, and the capping layer 480, the second conductive layer 470, the barrier layer 460 and the first conductive layer 450 may be sequentially stacked using the first mask 574 as an etching mask.

In some example embodiments, the first mask 574 may extend in the second direction D2, and a plurality of first masks 574 may be spaced apart from each other in the first direction D1.

By the etching process, on the first region I of the substrate 300, a third conductive pattern 454, a second barrier pattern 464, a fourth conductive pattern 474, a second capping pattern 484 and a first mask 574 may be sequentially stacked in the first opening 440, and a third insulation pattern 385, the third conductive pattern 454, the second barrier pattern 464, the fourth conductive pattern 474, the second capping pattern 484 and the first mask 574 may be sequentially stacked on the second insulation layer 370 of the insulation layer structure 390 at an outside of the first opening 440.

Hereinafter, the third conductive pattern 454, the second barrier pattern 464, the second capping pattern 484 and the first mask 574 sequentially stacked may be referred to as a bit line structure 584. In some example embodiments, the bit line structure 584 may extend in the second direction D2 on the first region I of the substrate 300, and a plurality of bit line structures 584 may be spaced apart from each other in the first direction D1.

Figure 28:
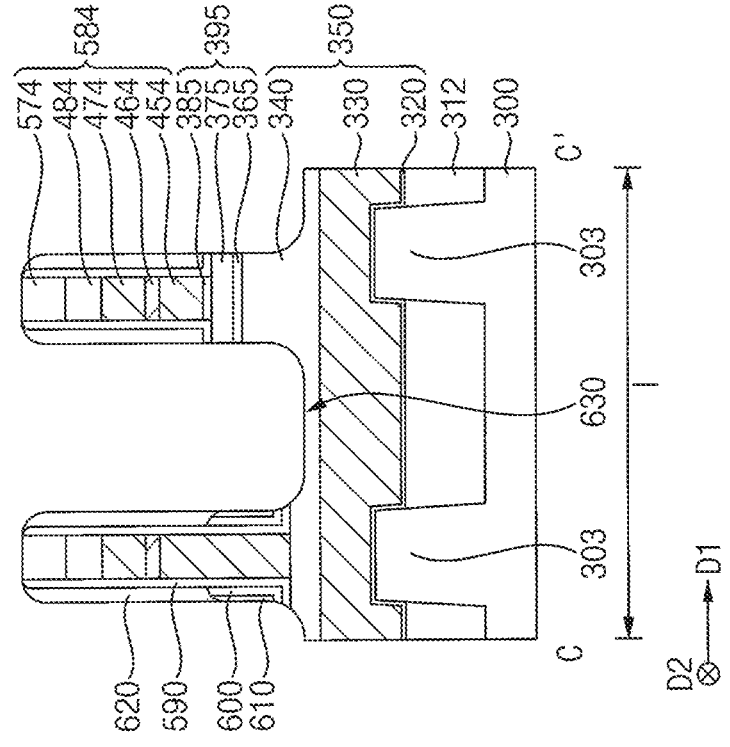
Figure 28:
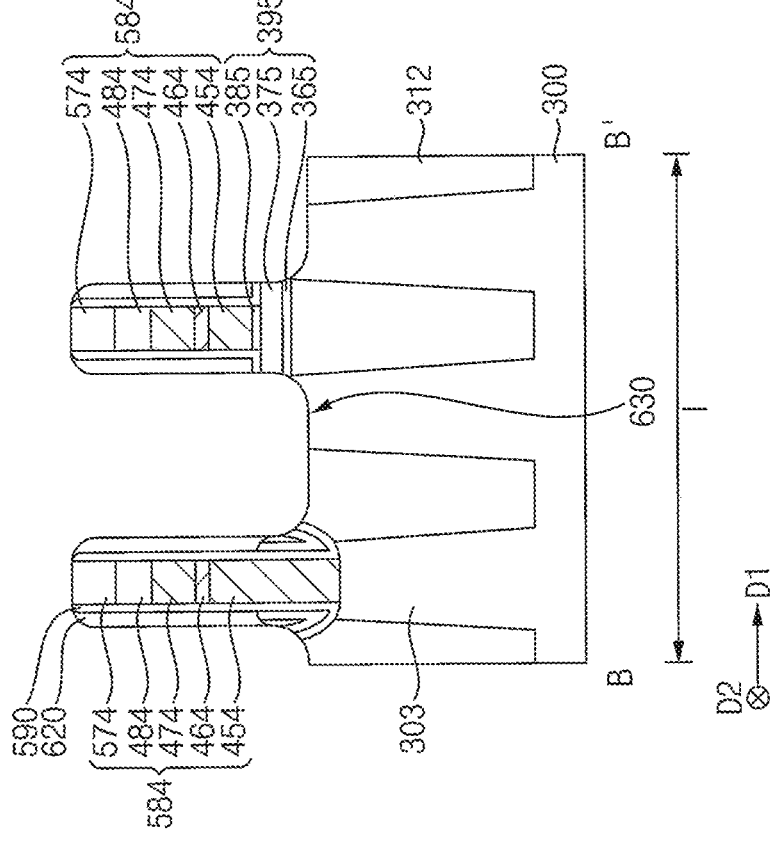

Referring to FIG. 28, a first spacer layer may be formed on the substrate 300 having the bit line structure 584 thereon, and fourth and fifth insulation layers may be formed on the first spacer layer.

The first spacer layer may cover a sidewall of the third insulation pattern 385, which is under a portion of the bit line structure 584 and on the second insulation layer 370, and the fifth insulation layer may fill a remaining portion of the first opening 440.

The first spacer layer may include nitride (e.g., silicon nitride), the fourth insulation layer may include an oxide (e.g., silicon oxide), and the fifth insulation layer may include a nitride (e.g., silicon nitride).

The fourth and fifth insulation layers may be etched by an etching process. In some example embodiments, the etching process may be performed by a wet etch process using an etching solution including phosphorous acid ($H_3PO_4$), SCl, hydrogen fluoride (HF), and other portions of the fourth and fifth insulation layers except for a portion in the first opening 440 may be removed. Thus, most of an entire surface of the first spacer layer, that is, an entire surface except for a portion thereof in the first opening 440 may be exposed, and portions of the fourth and fifth insulation layers remaining in the first opening 440 may form fourth and fifth insulation patterns 600 and 610, respectively.

A second spacer layer may be formed on the exposed surface of the first spacer layer and the fourth and fifth insulation patterns 600 and 610 in the first opening 440, and may be anisotropically etched to form a second spacer 620 on the surface of the first spacer layer and the fourth and fifth insulation patterns 600 and 610 to cover a sidewall of the bit line structure 584. The second spacer layer may include oxide (e.g., silicon oxide).

A dry etching process may be performed using the first mask 574 and the second spacer 620 as an etching mask to form a second opening 630 exposing the upper surface of the first active pattern 303. The upper surface of the isolation pattern structure 310 and the upper surface of the gate mask 340 may be also exposed by the second opening 630.

By the dry etching process, portions of the first spacer layer on upper surfaces of the first mask 574 and the second insulation layer 370, and thus a first spacer 590 covering the sidewall of the bit line structure 584 may be formed. Further, during the dry etching process, the first and second insulation layers 360 and 370 may be partially removed, such that first and second insulation patterns 365 and 375 may remain under the bit line structure 584. The first to third insulation patterns 365, 375 and 385 that are sequentially stacked under the bit line structure 584 may form an insulation pattern structure 395.

Figure 29:
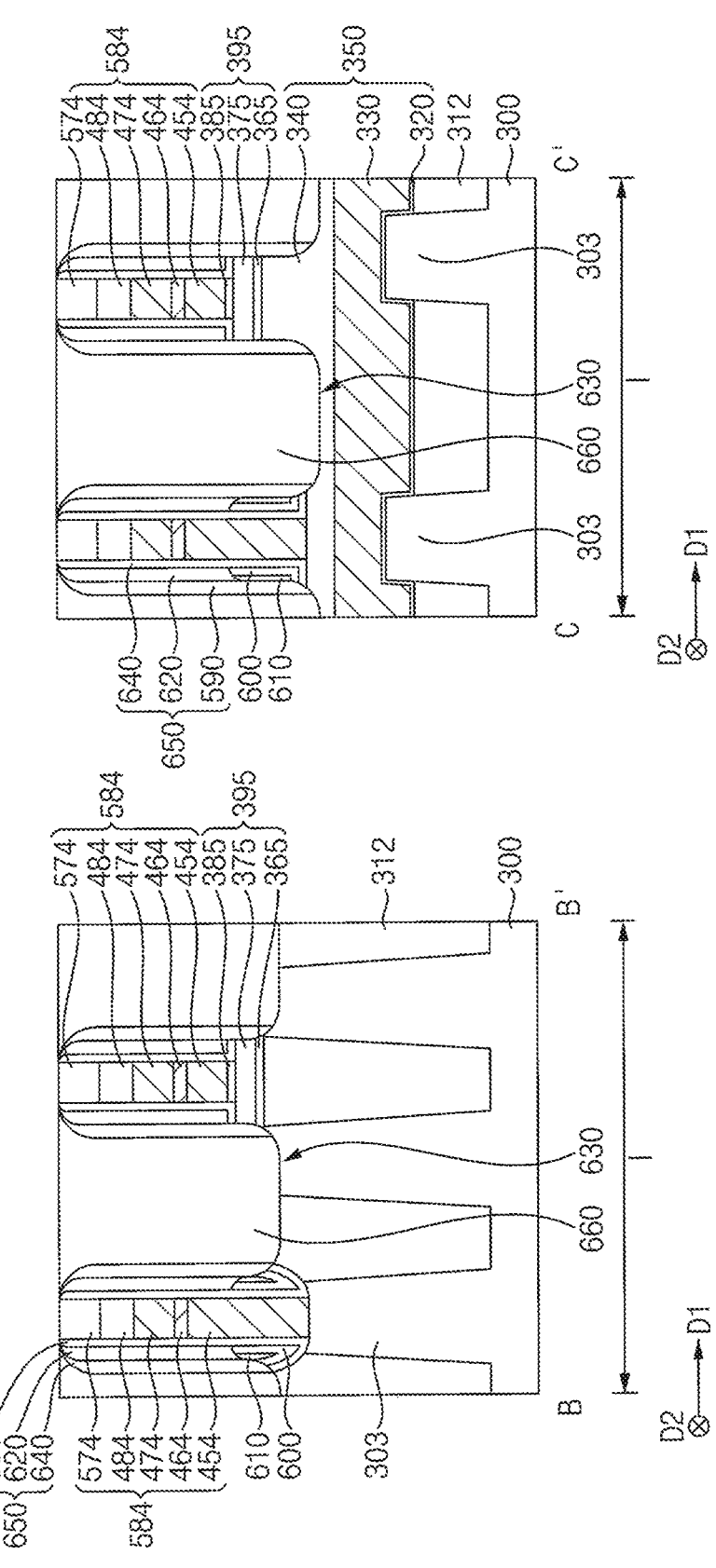

Referring to FIG. 29, a third spacer layer may be formed on the upper surface of the first mask 574, an outer sidewall of the second spacer 620, portions of upper surfaces of the fourth and fifth insulation patterns 600 and 610, the upper surfaces of the first active pattern 303, and the upper surfaces of the isolation pattern structure 310 and the gate mask 340 exposed by the second opening 630. Then, the third spacer layer may be anisotropically etched to form a third spacer 640 covering the sidewall of the bit line structure 584. The third spacer layer may include nitride (e.g., silicon nitride).

The fifth to seventh spacers 590, 620 and 640 sequentially stacked in the horizontal direction from the sidewall of the bit line structure 584 may be referred to as a preliminary spacer structure 650.

A third capping pattern 660 may be formed on the first region I of the substrate 300 to fill the second opening 630, and an upper portion of the third capping pattern 660 may be planarized until the upper surface of the first mask 574 is exposed. In some example embodiments, the third capping pattern 660 may extend in the second direction D2, and a plurality of third capping patterns 660 may be spaced apart from each other in the first direction D1 by the bit line structures 584. The third capping pattern 660 may include nitride (e.g., silicon nitride).

Figure 30:
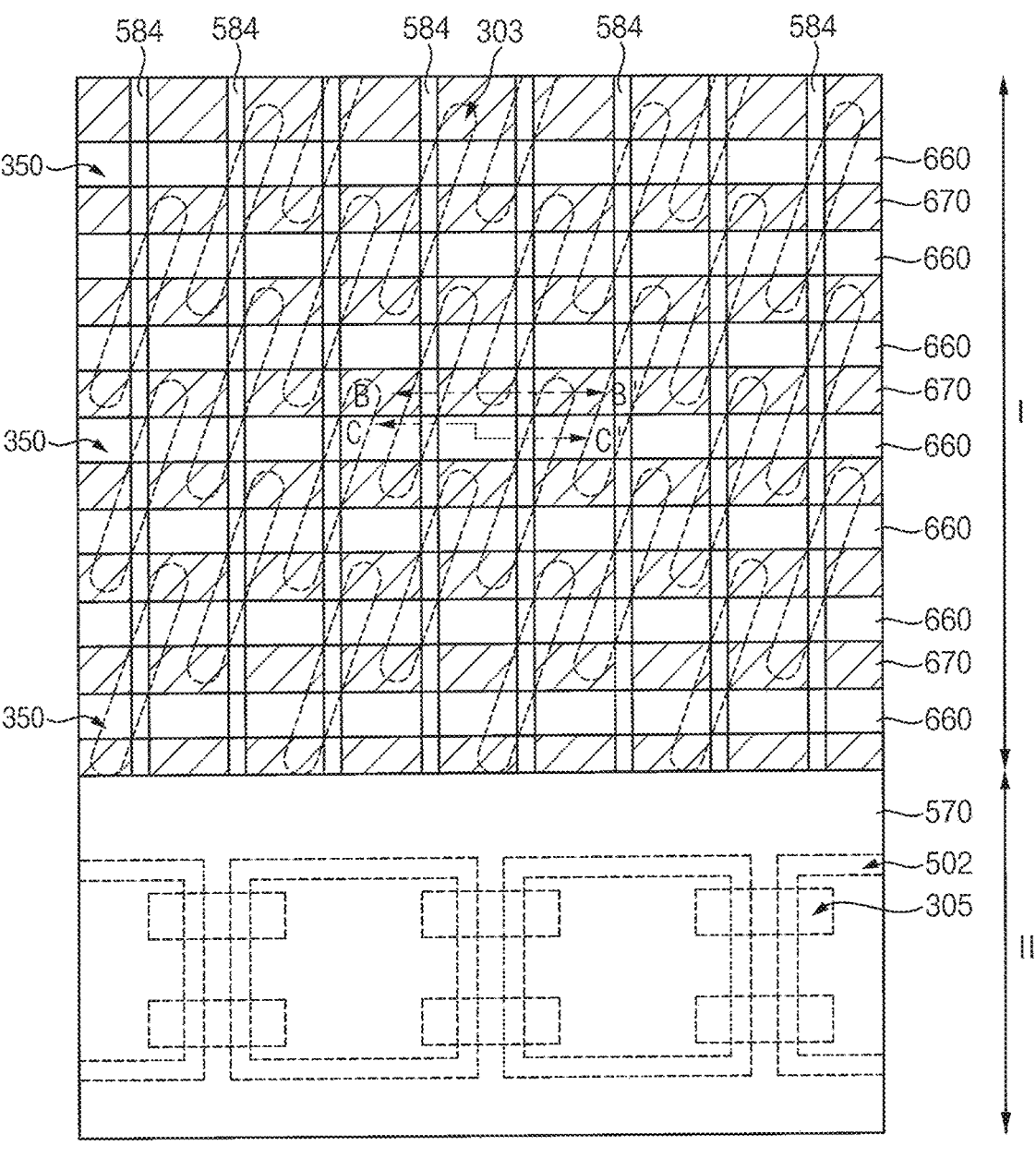
Figure 31:
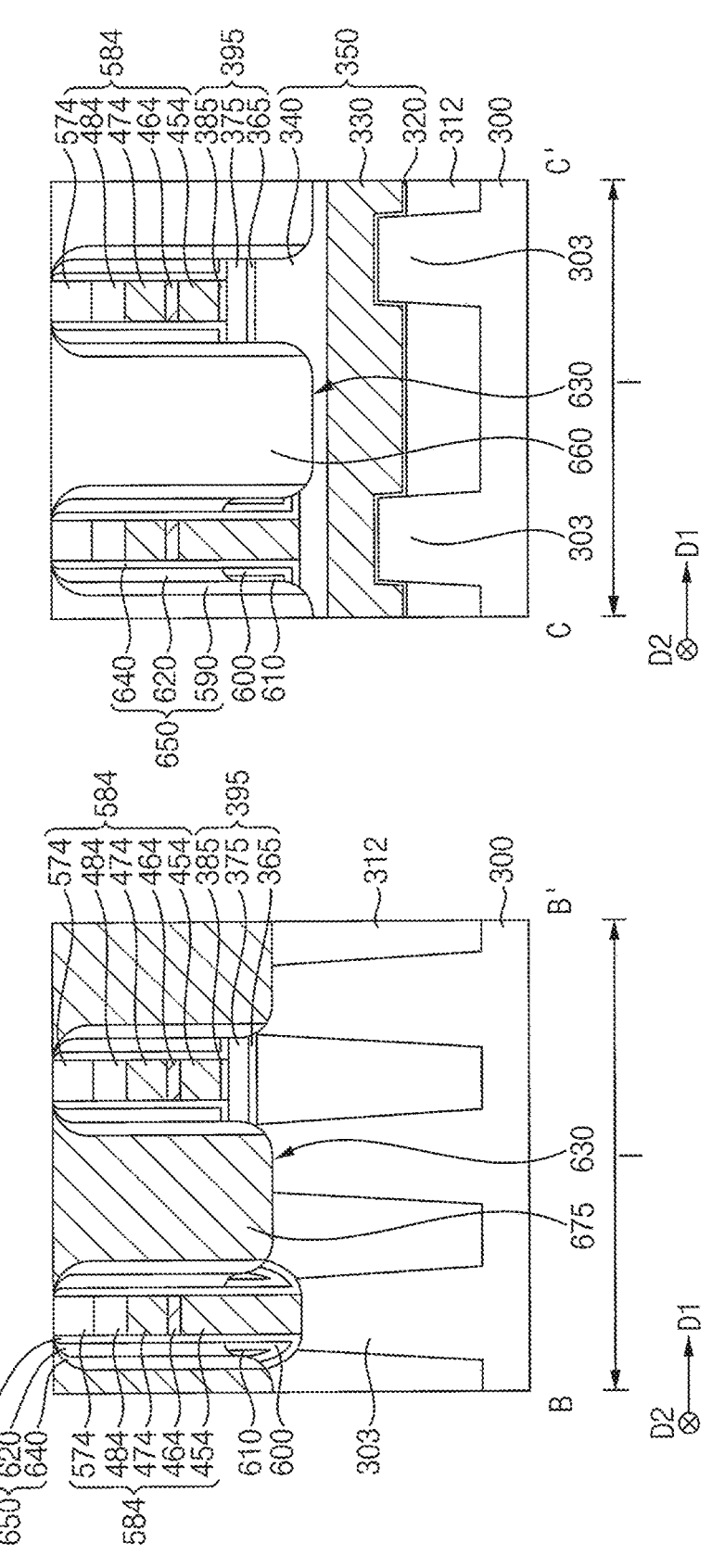

Referring to FIGS. 30 and 31, a second mask having a third openings extending in the first direction D1 and spaced apart from each other in the second direction D2 may be formed on the first mask 574 and the third capping pattern 660, and the third capping pattern 660 may be etched using the second mask as an etching mask.

In some example embodiments, each of the third openings may overlap the first gate structure 350 in the vertical direction. Thus, a fourth opening exposing an upper surface of the gate mask 340 of the first gate structure 350 may be formed between the bit line structures 584 on the first region I of the substrate 300.

After removing the second mask, a lower contact plug layer may be formed to fill the fourth opening, and an upper portion of the lower contact plug layer may be planarized until upper surfaces of the first mask 574 and the third capping pattern 660 are exposed. Thus, the lower contact plug layer may be divided into a plurality of lower contact plugs 675 spaced apart from each other in the second direction D2 between the bit line structures 584. Further, the third capping pattern 660 extending in the second direction D2 between the bit line structures may be divided into a plurality of pieces spaced apart from each other in the second direction D2 by the lower contact plugs 675.

The lower contact plug layer may include, for example, doped polysilicon.

Figure 32:
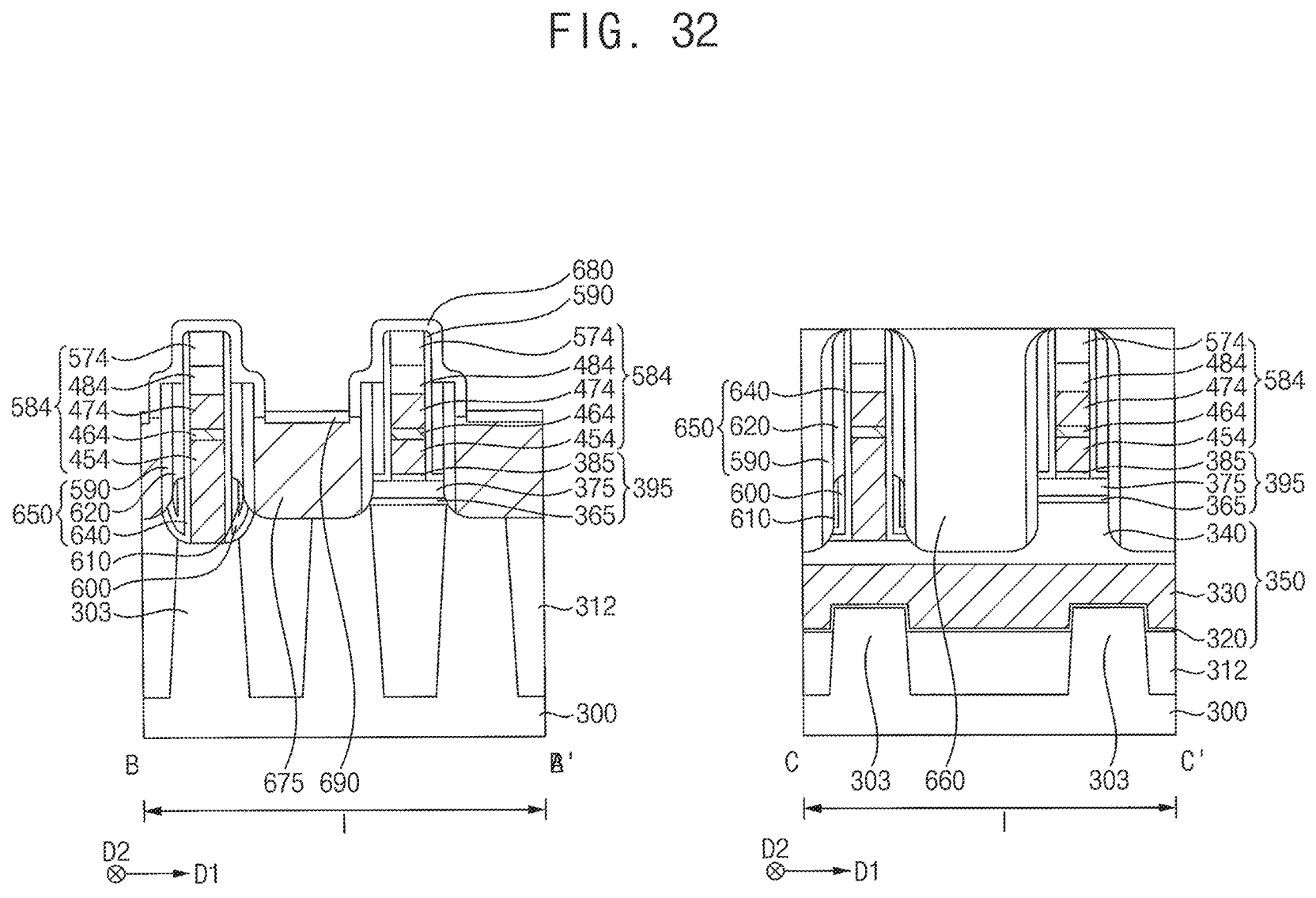

Referring to FIG. 32, an upper portion of the lower contact plug 675 may be removed to expose an upper portion of the preliminary spacer structure 650 on the sidewall of the bit line structure 584, and upper portions of the second and third spacers 620 and 640 of the exposed preliminary spacer structure 650 may be removed.

An etch back process may be further performed to remove an upper portion of the lower contact plug 675. Thus, the upper surface of the lower contact plug 675 may be lower than uppermost surfaces of the second and third spacers 620 and 640.

A fourth spacer layer may be formed on the bit line structure 584, the preliminary spacer structure 650 and the lower contact plug 675, and may be anisotropically etched so that a fourth spacer 680 may be formed to cover an upper portion of the preliminary spacer structure 650 on each of opposite sidewalls of the bit line structure 584 in the first direction D1 and that an upper surface of the lower contact plug 675 may be exposed.

A metal silicide pattern 690 may be formed on the exposed upper surface of the lower contact plug 675. In some example embodiments, the metal silicide patterns 690 may be formed by forming a first metal layer on the first mask 574, the third capping pattern 660, the fourth spacer 680, and the lower contact plug 675, thermally treating the first metal layer, and removing an unreacted portion of the first metal layer. The metal silicide patterns 690 may include, for example, cobalt silicide, nickel silicide, or titanium silicide.

Figure 33:
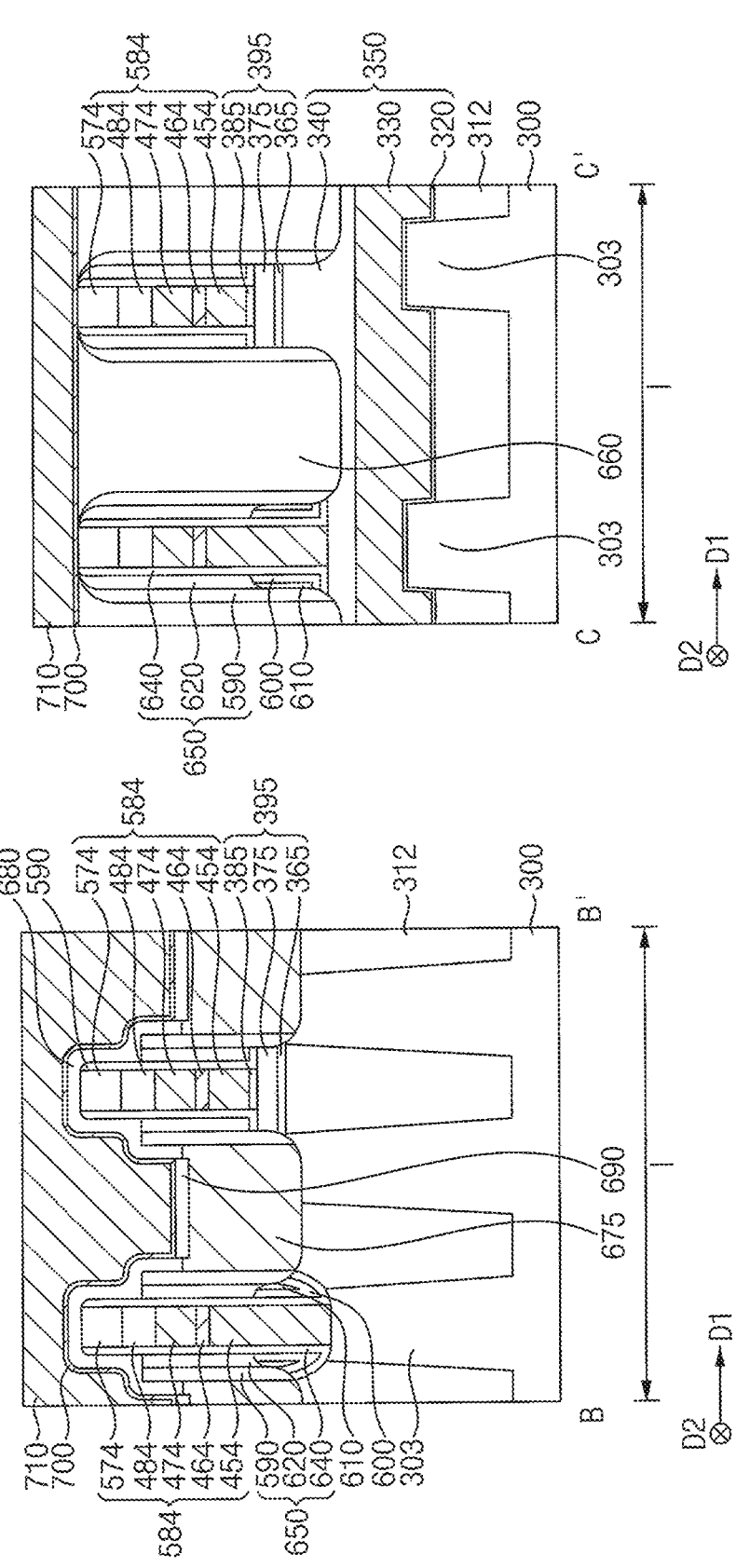

Referring to FIG. 33, a second barrier layer 700 may be formed on the first mask 574, the third capping pattern 660, the fourth spacer 680, the metal silicide pattern 690 and the lower contact plug 675, and a second metal layer 710 may be formed on the second barrier layer 700 to fill a space between the bit line structures 584.

An planarization process may be further performed on the second metal layer 710. The planarization process may include a chemical mechanical polishing (CMP) process and/or an etch back process.

Figure 34:
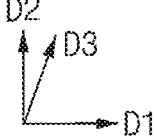
Figure 35:
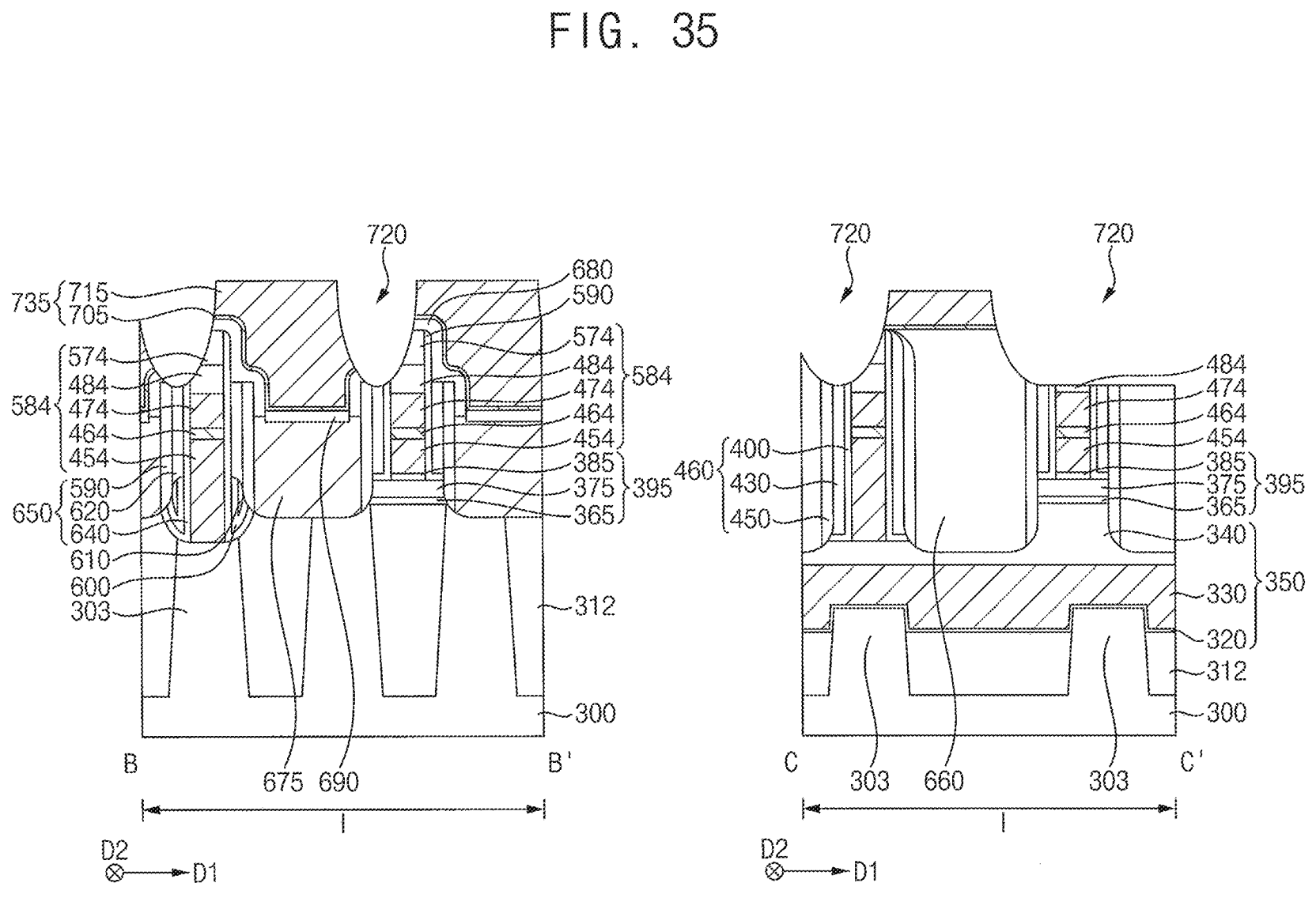
Figure 37:
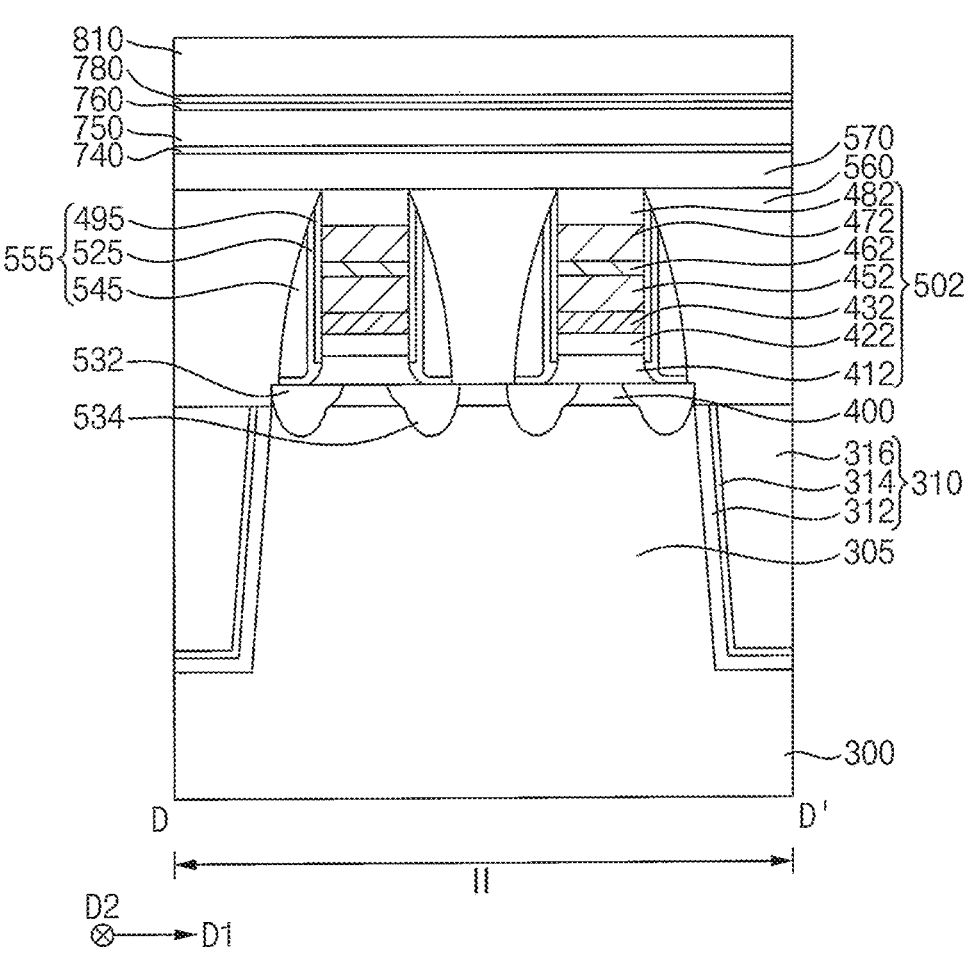

Referring to FIGS. 34 and 35, the second metal layer 710 and the second barrier layer 700 may be patterned to form an upper contact plug 735, and a fifth opening 720 may be formed between the upper contact plugs 735.

The fifth opening 720 may be formed by partially removing not only the second metal layer 710 and the second barrier layer 700 but also the first mask 574, the third capping pattern 660, the fourth spacer 680 and the second capping pattern 484, and thus an upper surface of the second spacer 620 may be exposed.

As the fifth opening 720 is formed, the second metal layer 710 and the second barrier layer 700 may be transformed into a second metal pattern 715 and a second barrier pattern 705 covering a lower surface of the second metal pattern 715, which may form the upper contact plug 735. In some example embodiments, a plurality of upper contact plugs 735 may be spaced apart from each other in each of the first and second directions D1 and D2, and may be arranged in a honeycomb pattern in a plan view. Each of the upper contact plugs 735 may have a shape of a circle, ellipse, polygon, etc., in a plan view.

The lower contact plug 675, the metal silicide pattern 690 and the upper contact plug 735 sequentially stacked on the first region I of the substrate 100 may form a contact plug structure.

Figure 36:
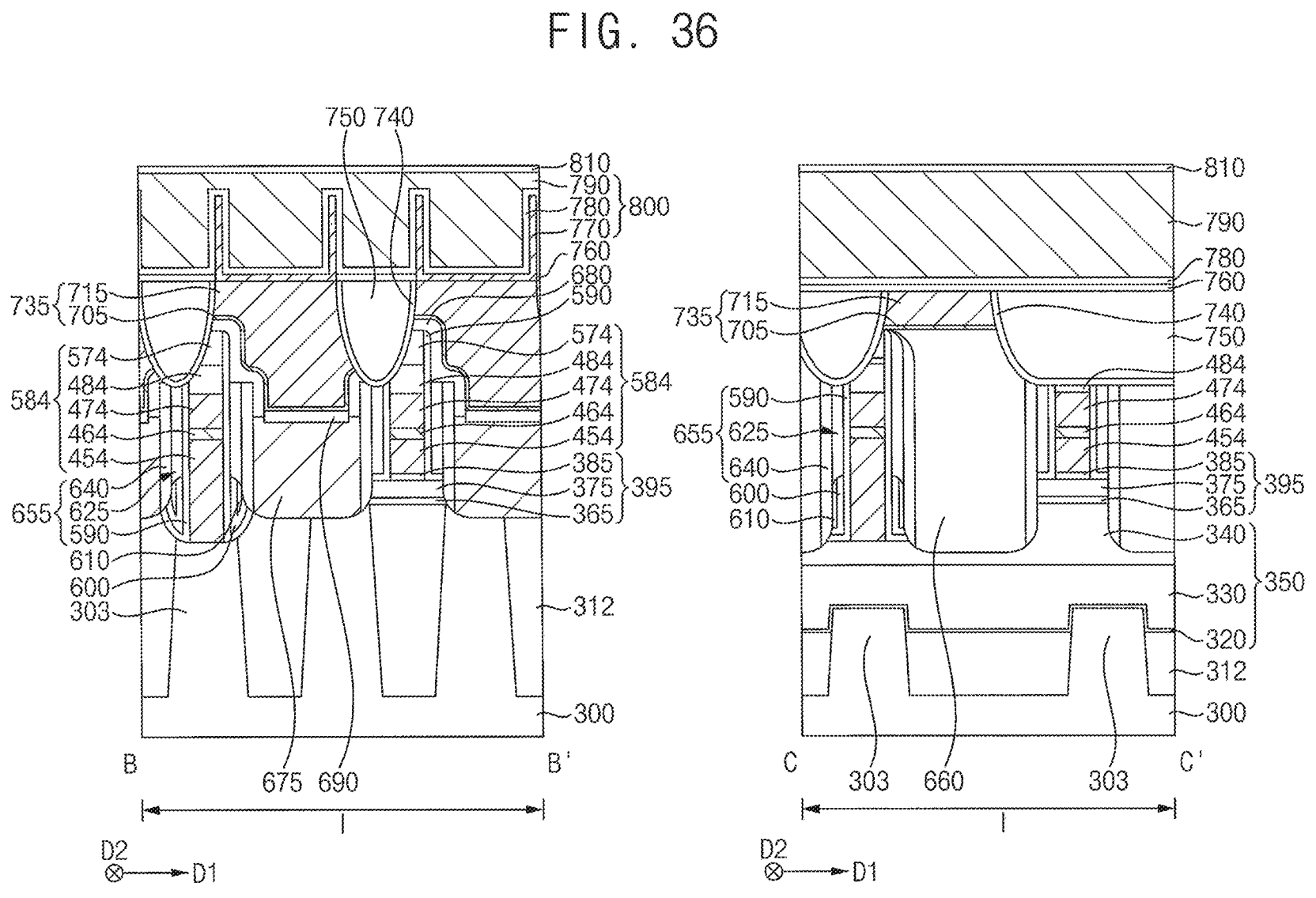

Referring to FIG. 36, the exposed second spacer 620 may be removed to form an air gap 625 connected to the fifth opening 720. The second spacer 620 may be removed by, for example, a wet etching process.

In some example embodiments, not only a portion of the second spacer 620 on the sidewall of the bit line structure 584 extending in the second direction D2 directly exposed by the fifth opening 720 but also other portions of the second spacer 620 parallel to the directly exposed portion thereof in the horizontal direction may be removed. That is, not only the portion of the second spacer 620 exposed by the fifth opening 720 not to be covered by the upper contact plug 735 but also a portion of the second spacer 620 adjacent to the exposed portion in the second direction D2 to be covered by the upper contact plug 735 may be removed.

A second insulating interlayer may be formed to fill the fifth opening 720. In some example embodiments, the second insulating interlayer may include sixth and seventh insulation layers 740 and 750. The sixth insulation layer 740 may include an insulating material having a poor gap filling characteristic, and thus the air gap 625 under the fifth opening 720 may not be filled. The remaining air gap 625 may be referred to as an air spacer 625, and the first and third spacers 590 and 640 and the air spacer 625 may form a spacer structure 655. That is, the air spacer 625 may include air therein. The seventh insulation layer 750 may include oxide (e.g., silicon oxide) or nitride (e.g., silicon nitride).

A capacitor 800 may be formed to contact an upper surface of the upper contact plug 735.

For example, an etch stop layer 760 and a mold layer (not shown) may be sequentially formed on the upper contact plug 735 and the second insulating interlayer, and partially etched to form a sixth opening partially exposing the upper surface of the upper contact plug 735. The etch stop layer 760 may include nitride (e.g., silicon nitride).

A lower electrode layer (not shown) may be formed on a sidewall of the sixth opening, the exposed upper surface of the upper contact plug 735 and the mold layer, a sacrificial layer (not shown) may be formed on the lower electrode layer to fill the sixth opening, and the lower electrode layer and the sacrificial layer may be planarized until an upper surface of the mold layer is exposed to divide the lower electrode layer. The sacrificial layer and the mold layer may be removed by, for example, a wet etching process, and thus a lower electrode 770 having a cylindrical shape may be formed on the exposed upper surface of the upper contact plug 735. Alternatively, the lower electrode 770 may have a pillar shape filling the sixth opening. The lower electrode 770 may include, for example, metal, metal nitride, metal silicide, or doped polysilicon.

A dielectric layer 780 may be formed on a surface of the lower electrode 770 and the etch stop layer 760, and an upper electrode 790 may be formed on the dielectric layer 780 so that the capacitor 800 including the lower electrode 770, the dielectric layer 780 and the upper electrode 790 may be formed.

The dielectric layer 780 may include, for example, metal oxide, and the upper electrode 790 may include, for example, metal, metal nitride, metal silicide, or doped polysilicon.

A third insulating interlayer 810 may be formed on the capacitor 800 on the first region I of the substrate 300 and the dielectric layer 780 on the second region II of the substrate 300 to complete the fabrication of the semiconductor device. The third insulating interlayer 810 may include n oxide (e.g., silicon oxide).

The semiconductor device manufactured by the above processes may have the following structural characteristics.

The semiconductor device may include the substrate 300 having the first region I and the second region II surrounding the first region I, the first and second active patterns 303 and 305 on the first and second regions I and II, respectively, the isolation pattern structure 310 covering the sidewalls of the first and second active patterns 303 and 305, the first gate structure 350 buried at upper portions of the first active pattern 303 and the isolation pattern structure 310, the second gate structure 502 on the second active pattern 305 and having a sidewall including a concave lower portion and a vertical upper portion, the gate spacer structure 555 having the first gate spacer 495 on the upper portion of the sidewall of the second gate structure 502, the second gate spacer 525 on the lower portion of the sidewall of the second gate structure 502 and the outer sidewall of the first gate spacer 495 and contacting the lower surface of the first gate spacer 495, and the third gate spacer 545 on the outer sidewall of the second gate spacer 525, the bit line structure 584 contacting a central upper surface of the first active pattern 303 and extending in the second direction D2, the contact plug structure contacting edge upper surfaces of the first active pattern 303, and the capacitor 800 on the contact plug structure. Further, the semiconductor device may include the epitaxial layer 400, the first and second impurity regions 532 and 534, the third capping pattern 660, the insulation pattern structure 395, the first and third insulating interlayers 560 and 810, the second insulating interlayer, and the etch stop layer 760.

In some example embodiments, a cross-section of the second gate spacer 525 in the vertical direction may have an "L" shape. Thus, the second gate spacer 525 may contact the first and second impurity regions 532 and 534, and the third gate spacer 545 may not contact the first and second impurity regions 532 and 534.

Figure 38:
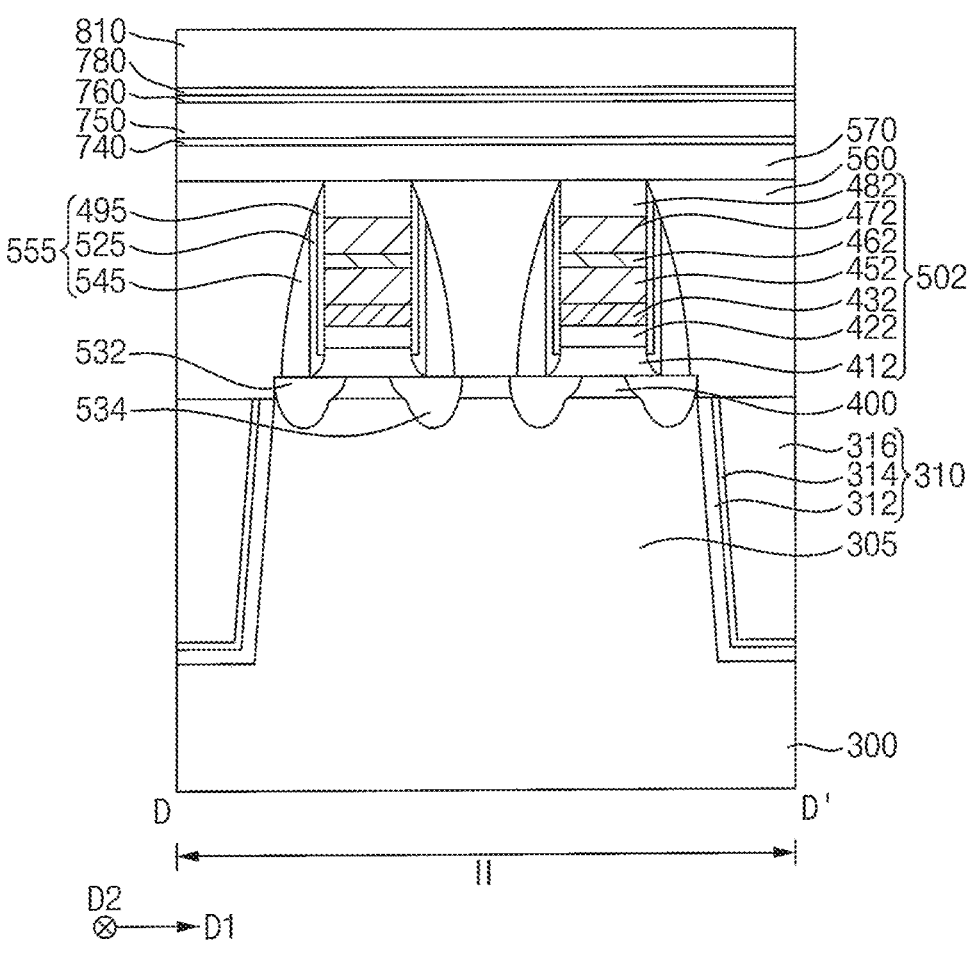
FIG. 38 is a cross-sectional view illustrating a semiconductor device according to an example embodiment.

FIG. 38 is a cross-sectional view illustrating a semiconductor device in accordance with an example embodiment. This semiconductor device may include elements the same as or substantially similar to those of the semiconductor device illustrated with reference to FIGS. 12 to 37, and thus repeated explanations thereof are omitted herein.

Referring to FIG. 38, the third gate spacer 545 may contact the first and second impurity regions 532 and 534.

While the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
a gate structure on a substrate, a sidewall of the gate structure including,
a concave lower sidewall portion, and
an upper sidewall portion that is vertical with respect to an upper surface of the substrate,
a first gate spacer on the upper sidewall portion of the sidewall of the gate structure; and
a second gate spacer on the concave lower sidewall portion of the sidewall of the gate structure and an outer sidewall of the first gate spacer,
wherein the second gate spacer contacts a lower surface of the first gate spacer and includes nitride,
wherein the gate structure includes a first dielectric pattern adjacent to the upper surface of the substrate, and
wherein the lower surface of the first gate spacer is lower than an upper surface of the first dielectric pattern.

2. The semiconductor device according to claim 1, wherein a cross-section of the second gate spacer in a vertical direction with respect to the upper surface of the substrate has an "L" shape.

3. The semiconductor device according to claim 1, wherein the first dielectric pattern includes silicon oxide, and
wherein a sidewall of the first dielectric pattern includes a portion defining the concave lower sidewall portion of the gate structure.

4. The semiconductor device according to claim 3, wherein the gate structure further includes a second dielectric pattern, a first conductive pattern, a barrier pattern, and a second conductive pattern sequentially stacked on the first dielectric pattern in a vertical direction with respect to the upper surface of the substrate, and
wherein the second dielectric pattern includes a material having a dielectric constant higher than a dielectric constant of silicon oxide.

5. The semiconductor device according to claim 1, further comprising:
a third gate spacer on an outer sidewall of the second gate spacer,
wherein the third gate spacer includes silicon oxide.

6. The semiconductor device according to claim 5, wherein a volume of the third gate spacer is greater than a sum of volumes of the first gate spacer and the second gate spacer.

7. The semiconductor device according to claim 1, wherein an entire portion of the lower surface of the first gate spacer contacts the second gate spacer.

8. The semiconductor device according to claim 1, further comprising impurity regions at upper portions of the substrate that are adjacent to the gate structure.

9. A semiconductor device comprising:

a gate structure on a substrate, the gate structure including a first dielectric pattern containing silicon oxide;

a first gate spacer contacting an upper portion of a sidewall of the gate structure, the first gate spacer including silicon nitride; and a second gate spacer contacting a lower portion of the sidewall of the gate structure and an outer sidewall of the first gate spacer, the second gate spacer including silicon nitride, wherein a lower surface of the first gate spacer is lower than an upper surface of the first dielectric pattern, and the second gate spacer does not contact an upper portion of a sidewall of the first dielectric pattern but contacts a lower portion of the sidewall of the first dielectric pattern.

10. The semiconductor device according to claim 9, wherein the lower portion of the sidewall of the first dielectric pattern contacts the second gate spacer is concave.

11. The semiconductor device according to claim 10, wherein the second gate spacer contacts the lower surface of the first gate spacer.

12. The semiconductor device according to claim 9, wherein a cross-section of the second gate spacer in a vertical direction with respect to an upper surface of the substrate has an "L" shape.

13. The semiconductor device according to claim 9, further comprising:

a third gate spacer contacting an outer sidewall of the second gate spacer, wherein the third gate spacer includes silicon oxide.

14. The semiconductor device according to claim 13, wherein a volume of the third gate spacer is greater than a sum of volumes of the first gate spacer and the second gate spacer.

15. The semiconductor device according to claim 9, further comprising impurity regions at upper portions of the substrate adjacent to the gate structure.

16. The semiconductor device according to claim 9, wherein the gate structure further includes a second dielectric pattern, a first conductive pattern, a barrier pattern, and a second conductive pattern sequentially stacked on the first dielectric pattern in a vertical direction with respect to the upper surface of the substrate, wherein the second dielectric pattern includes a material having a dielectric constant higher than a dielectric constant of silicon oxide, and wherein a sidewall of the second dielectric pattern contacts the first gate spacer.

17. A semiconductor device comprising:

a substrate including a cell region and a peripheral circuit region surrounding the cell region;

a first active pattern on the cell region of the substrate;

a second active pattern on the peripheral circuit region of the substrate;

an isolation pattern covering sidewalls of the first active pattern and the second active pattern;

a first gate structure buried at upper portions of the first active pattern and the isolation pattern, the first gate structure extending in a first direction substantially parallel to an upper surface of the substrate;

a second gate structure on the second active pattern, a sidewall of the second gate structure including, a concave lower sidewall portion, and an upper sidewall portion that is vertical with respect to the upper surface of the substrate, a gate spacer structure including, a first gate spacer on the upper sidewall portion of the sidewall of the second gate structure, a second gate spacer on the concave lower sidewall portion of the sidewall of the second gate structure and an outer sidewall of the first gate spacer, the second gate spacer contacting a lower surface of the first gate spacer and including silicon nitride, and a third gate spacer on an outer sidewall of the second gate spacer;

a bit line structure contacting a central upper surface of the first active pattern, the bit line structure extending in a second direction substantially parallel to the upper surface of the substrate and substantially perpendicular to the first direction;

a contact plug structure contacting each of opposite edge upper surfaces of the first active pattern; and a capacitor on the contact plug structure, wherein the second gate structure includes a first dielectric pattern adjacent to the upper surface of the substrate, and wherein the lower surface of the first gate spacer is lower than an upper surface of the first dielectric pattern.

18. The semiconductor device according to claim 17, wherein the second gate structure includes a second dielectric pattern, a first conductive pattern, a barrier pattern, and a second conductive pattern sequentially stacked on the second active pattern in a vertical direction with respect to the upper surface of the substrate, and wherein the first dielectric pattern includes silicon oxide, and the second dielectric pattern includes a material having a dielectric constant higher than a dielectric constant of silicon oxide.

19. The semiconductor device according to claim 17, further comprising impurity regions at upper portions of the substrate adjacent to the second gate structure.

* * * * *